(12) United States Patent
Suina

(10) Patent No.: US 11,639,961 B2
(45) Date of Patent: May 2, 2023

(54) FAILURE DETECTION CIRCUIT AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kenji Suina, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 268 days.

(21) Appl. No.: 17/016,751

(22) Filed: Sep. 10, 2020

(65) Prior Publication Data
US 2021/0286005 A1    Sep. 16, 2021

(30) Foreign Application Priority Data
Mar. 11, 2020   (JP) .............................. JP2020-041695

(51) Int. Cl.
*G01R 31/317*   (2006.01)
(52) U.S. Cl.
CPC .............................. *G01R 31/31724* (2013.01)
(58) Field of Classification Search
None
See application file for complete search history.

(56) References Cited

U.S. PATENT DOCUMENTS

| | | | |
|---|---|---|---|
| 2014/0009168 A1* | 1/2014 | Trimmer | G01R 31/31725 324/555 |
| 2014/0132315 A1* | 5/2014 | Sharma | G01R 31/2884 327/142 |
| 2014/0289576 A1 | 9/2014 | Maekawa | |
| 2018/0198416 A1 | 7/2018 | Hur et al. | |
| 2018/0343070 A1 | 11/2018 | Fujita et al. | |

FOREIGN PATENT DOCUMENTS

| | | |
|---|---|---|
| JP | 2007-96647 A | 4/2007 |
| JP | 2014-185981 A | 10/2014 |
| JP | 2018-198416 A | 12/2018 |

* cited by examiner

*Primary Examiner* — Patrick Assouad
*Assistant Examiner* — Haidong Zhang
(74) *Attorney, Agent, or Firm* — Allen & Overy LLP

(57) ABSTRACT

A first circuit outputs a third signal having a first level during a period over which first and second signals have the same level, and having a second level during a period over which the first and second signals have different levels. A second circuit outputs a fifth signal having the first level during a period over which a fourth signal having the same level as the third signal has the same level as the first signal, and having the second level during a period over which the first and fourth signals have different levels. A third circuit outputs a sixth signal having a third level during a period over which the second and fifth signals have the same level, and having a fourth level during a period over which the second and fifth signals have different levels.

22 Claims, 21 Drawing Sheets

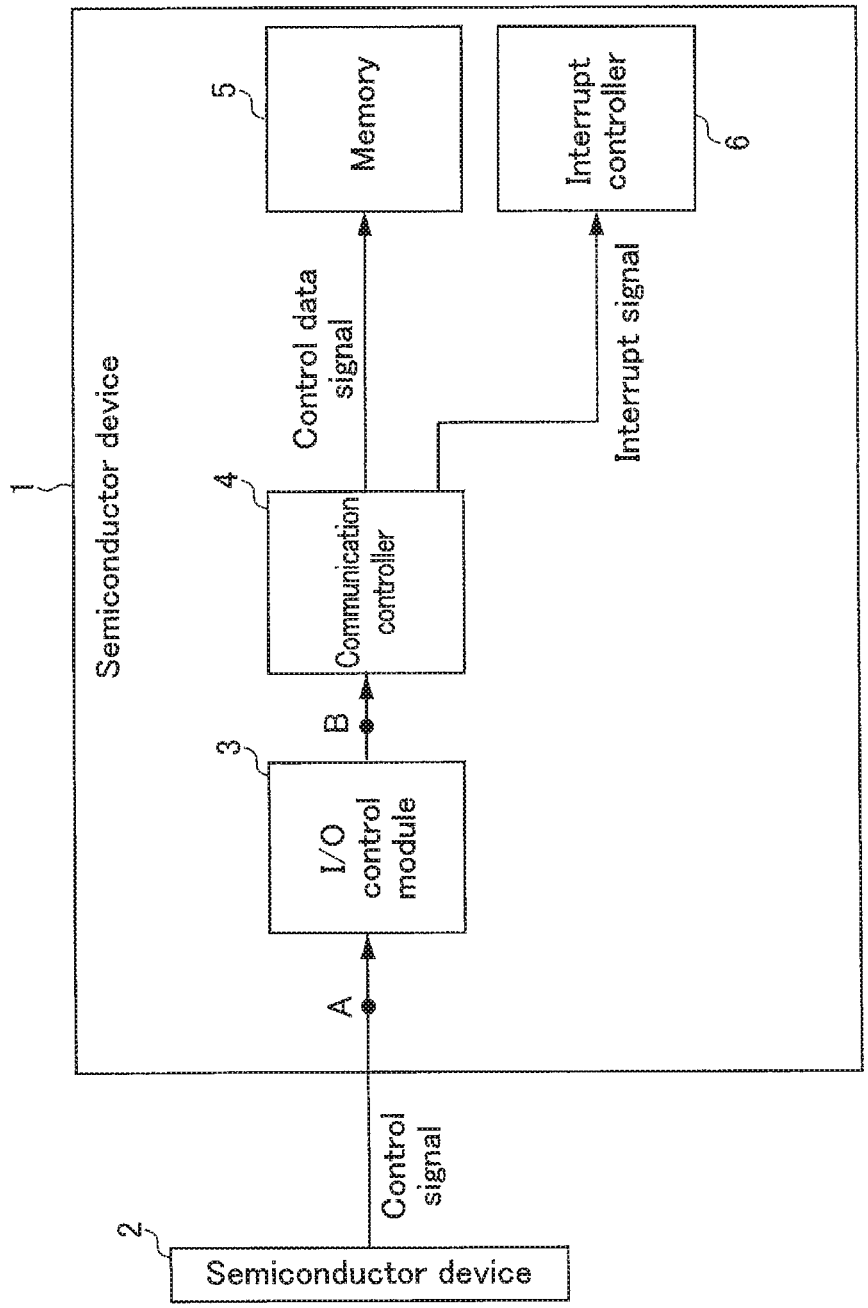
F I G. 6

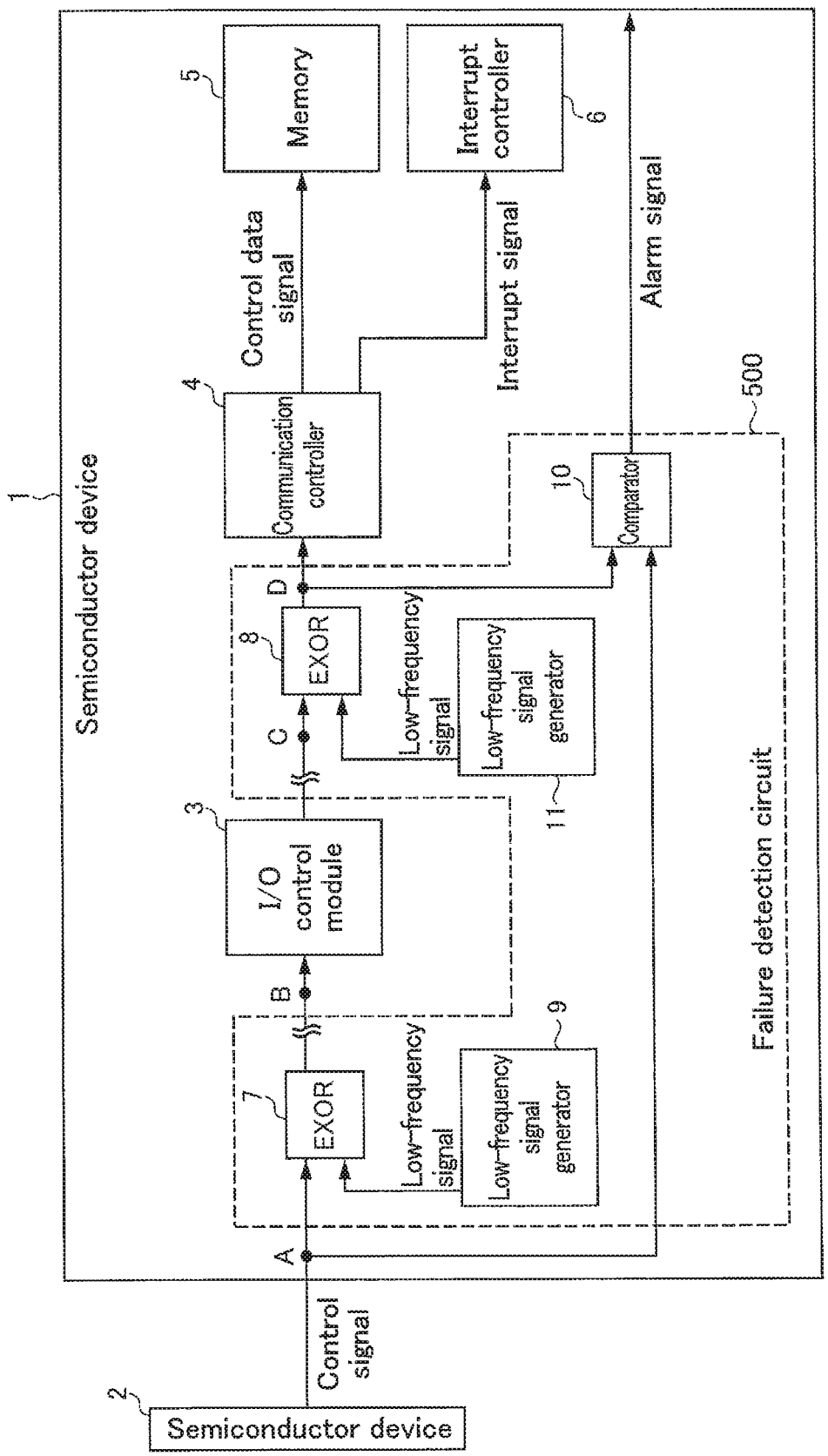
F I G. 9

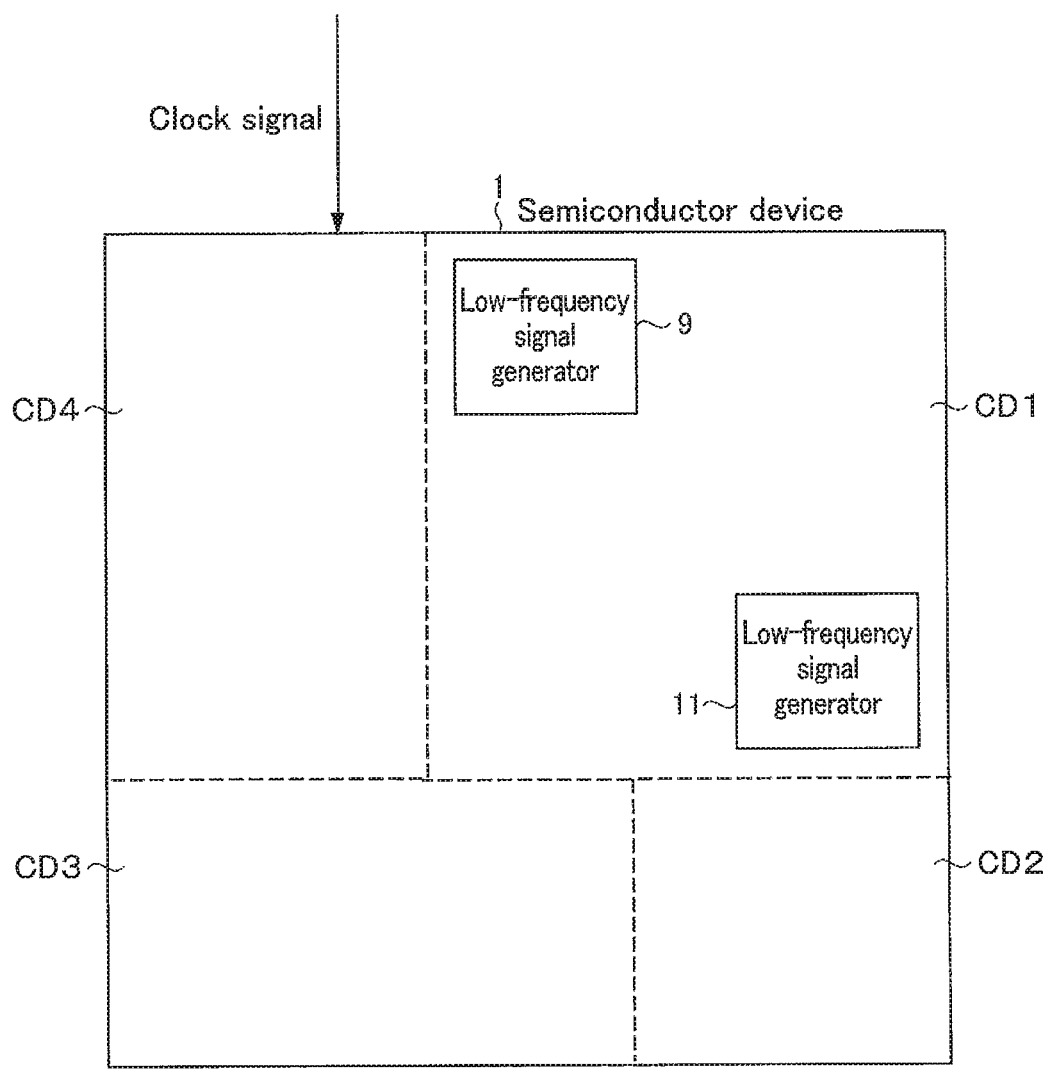
F I G. 10

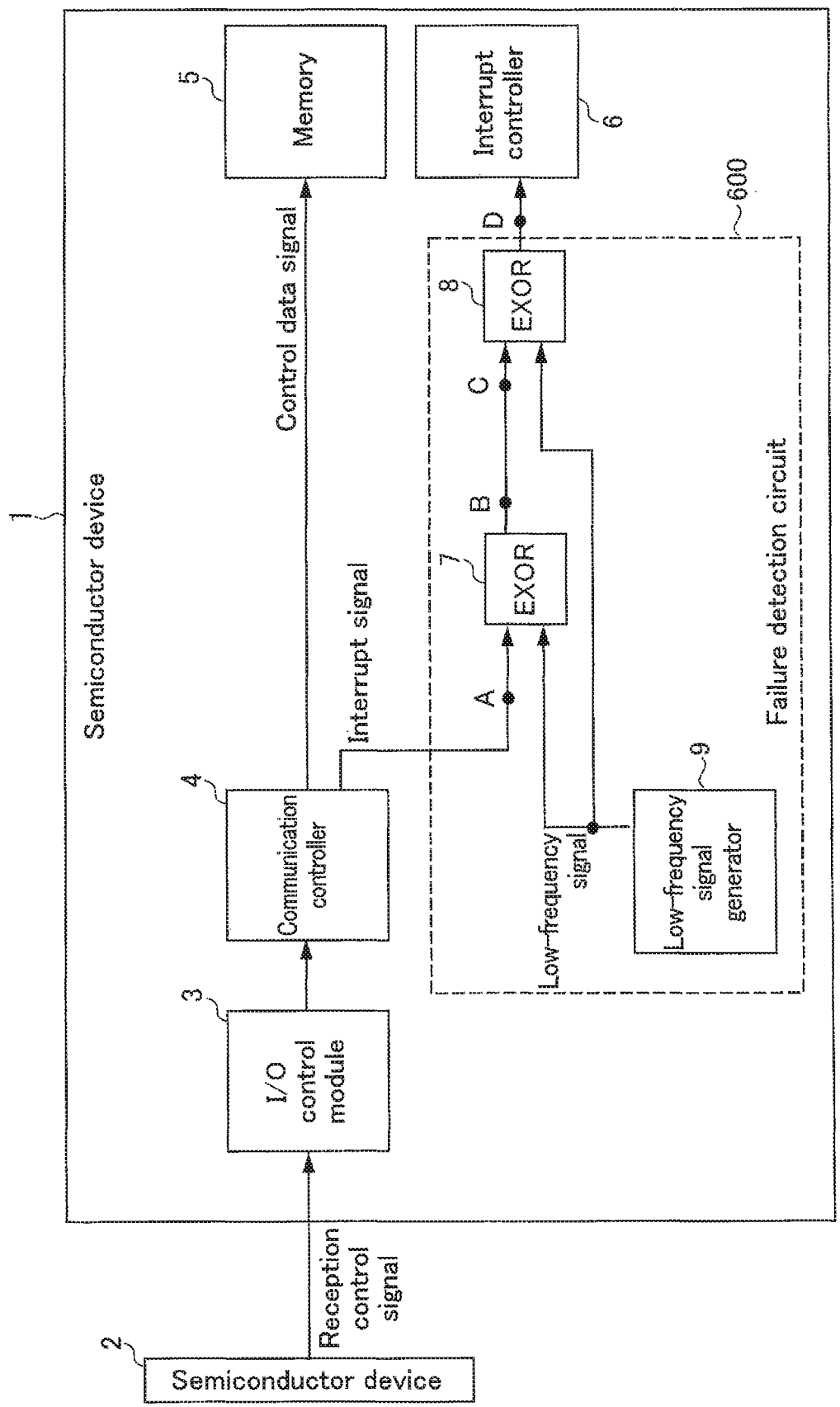
F I G. 14

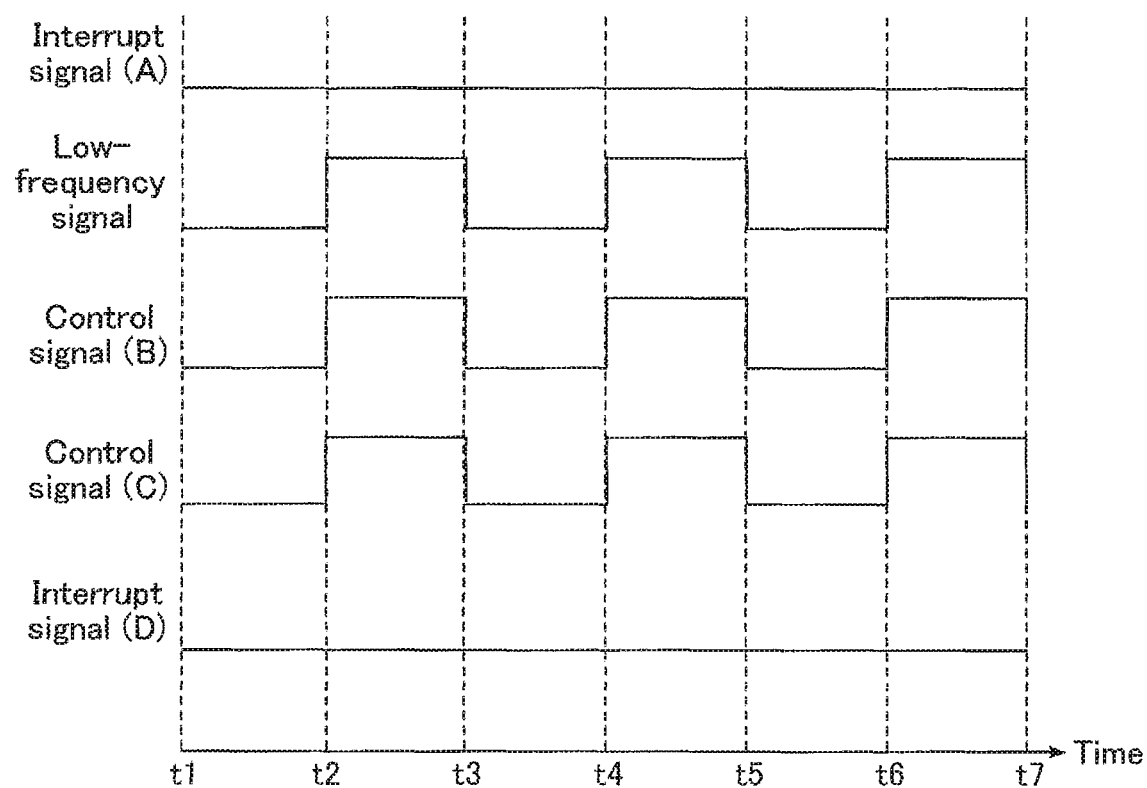
F I G. 15

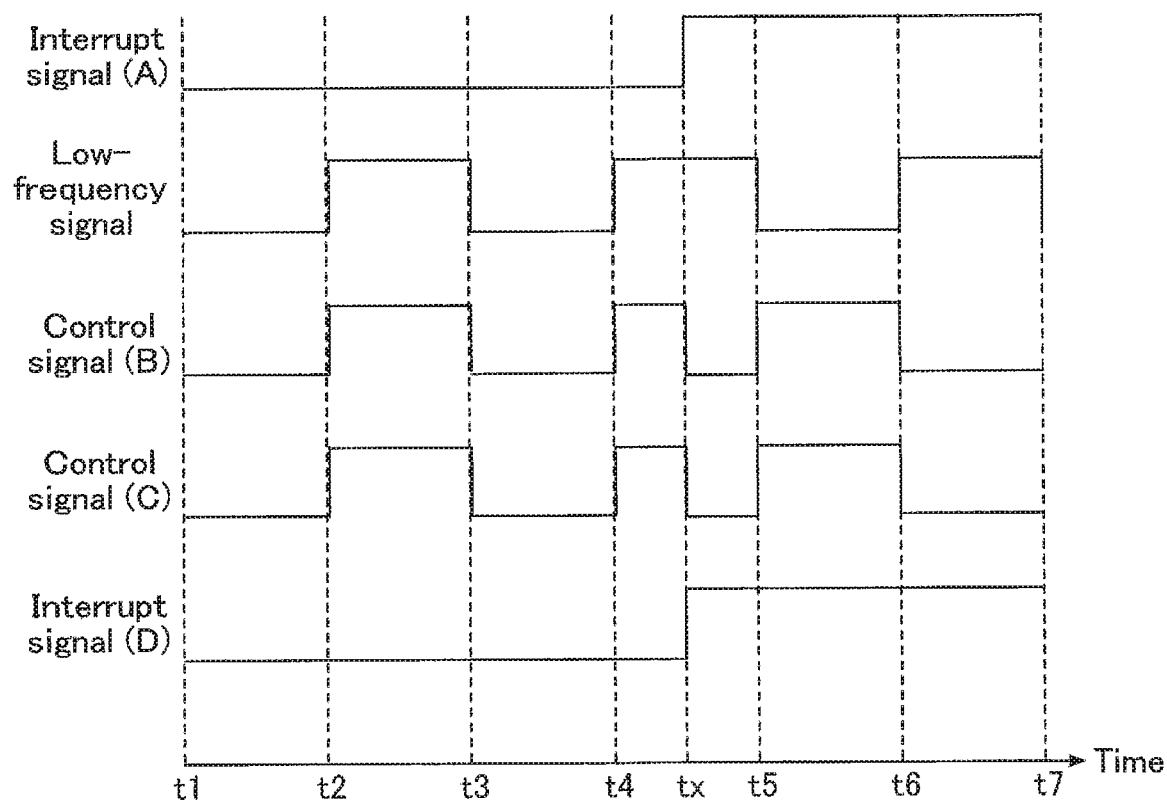
F I G. 16

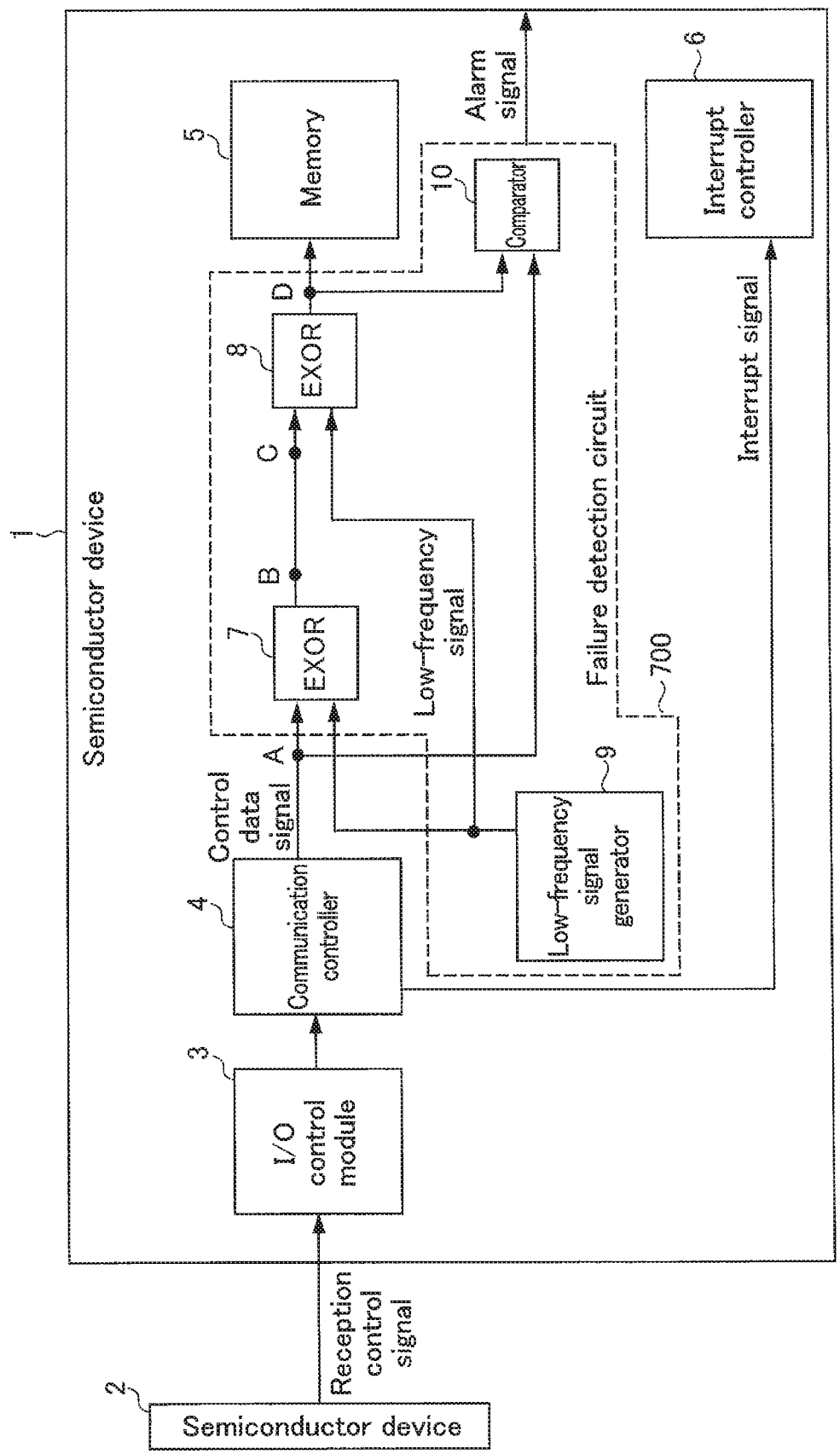
F I G. 18

FAILURE DETECTION CIRCUIT AND SEMICONDUCTOR DEVICE

CROSS-REFERENCE TO RELATED APPLICATIONS

This application is based upon and claims the benefit of priority from Japanese Patent Application No. 2020-041695, filed Mar. 11, 2020, the entire contents of which are incorporated herein by reference.

FIELD

Embodiments described herein relate generally to a failure detection circuit.

BACKGROUND

A failure diagnosis circuit for a logic circuit of a semiconductor device is known for use in a vehicle, factory industrial machine, and the like. Such a failure diagnosis circuit requires a reduction in an increase of a circuit scale.

BRIEF DESCRIPTION OF THE DRAWINGS

FIG. 6 illustrates functional blocks in a semiconductor device 1 according to a comparative example of the first embodiment;

FIG. 9 illustrates functional blocks in a semiconductor device 1 according to a second embodiment;

FIG. 10 illustrates an example of transmission of a clock signal of the semiconductor device 1 according to the second embodiment;

FIG. 14 illustrates functional blocks in a semiconductor device 1 according to a third embodiment;

FIG. 15 illustrates an example of a timing chart of each signal when the semiconductor device 1 according to the third embodiment is in a normal state and not in operation;

FIG. 16 illustrates an example of a timing chart of each signal when the semiconductor device 1 according to the third embodiment is in a normal state and has started communication;

FIG. 18 illustrates functional blocks in a semiconductor device 1 according to a fourth embodiment;

DETAILED DESCRIPTION

Figure 1:
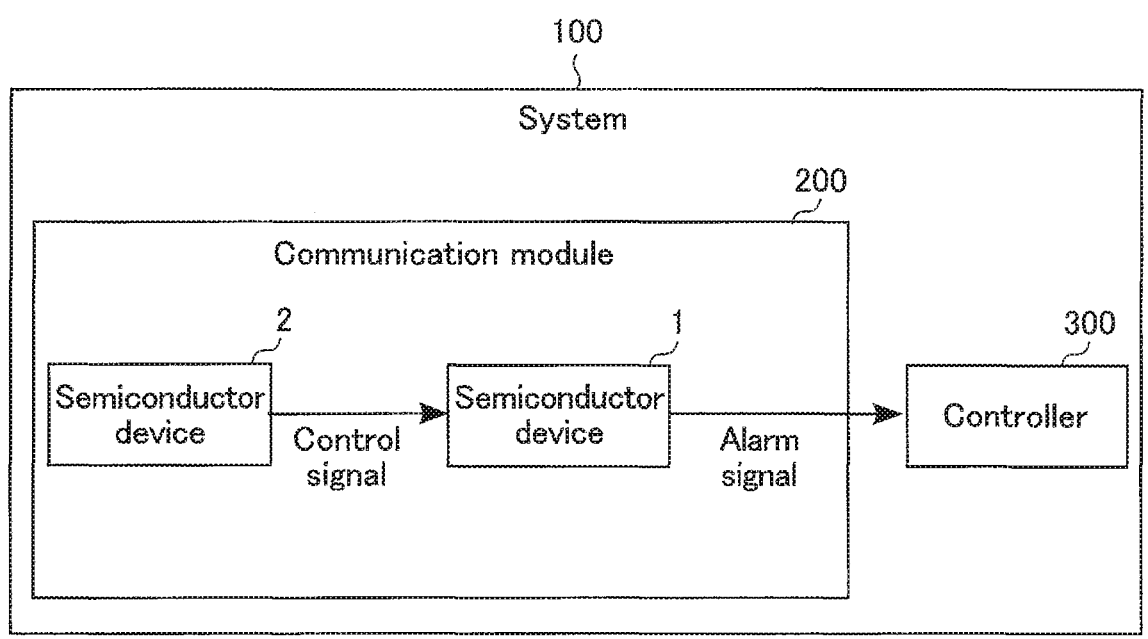
FIG. 1 illustrates functional blocks in a system 100 according to a first embodiment.

In general, according to one embodiment, a failure detection circuit includes a first signal generation circuit, a first circuit, a second circuit, and a third circuit. The first signal generation circuit outputs a first signal. The first signal has a level that changes periodically between a first level and a second level. The first circuit outputs a third signal. The third signal has the first level during a period over which a second signal having the first level or the second level has the same level as the first signal. The third signal has the second level during a period over which the second signal has a level different from the first signal. The second circuit outputs a fifth signal. The fifth signal has the first level during a period over which a fourth signal having the same level as the third signal has the same level as the first signal. The fifth signal has the second level during a period over which the fourth signal has a level different from the first signal The third circuit outputs a sixth signal. The sixth signal has a third level during a period over which the second signal and the fifth signal have the same level. The sixth signal has a fourth level during a period over which the second signal and the fifth signal have different levels.

Hereinafter, embodiments will be described with reference to the accompanying drawings. In the following description, components with substantially the same functionalities and configurations will be referred to with the same reference numerals, and repeat descriptions may be omitted. Each functional block can be implemented as hardware, computer software, or a combination of both. For this reason, in order to clearly illustrate that each block can be any of them, descriptions will be given in terms of their functionalities in general. It is not necessary for each functional block to be distinguished as in the following examples. For example, some of the functions may be implemented by functional blocks different from those illustrated below. In addition, the function blocks to be described as examples may be divided into smaller function subblocks.

No step in a flow of a method of an embodiment is limited to any illustrated order, and each step can occur in an order different from an illustrated order and/or can occur concurrently with another step unless stated otherwise.

In the specification and the claims, a phrase referring to a particular first component being "coupled" to another second component encompasses the first component being coupled to the second component either directly, or via one or more components which are always or selectively conductive.

Moreover, in the specification, "H" level and "L" level for a certain signal merely indicate a higher level and a lower level, respectively, of two levels that the signal may have. Thus, "H" level of a certain signal and "H" level of another signal may not have the same potential, and "L" level of a certain signal and "L" level of another signal may not have the same potential.

Similarly, in the claims, a first level of a certain signal and a first level of another signal may not have the same potential, and a second level of a certain signal and a second signal of another signal may not have the same potential. A first signal for each signal merely indicates one of two levels that the signal may have, while a second level for each signal indicates the other of two levels that the signal may have. Therefore, if a certain signal has the first level and another signal has the first level, these two signals each have the higher level of the two levels, or the lower level of the two levels.

In the specification, a state referred to as "the semiconductor device 1 being in a normal state" indicates a state in which all devices and conductive wires included in the semiconductor device 1 are functioning as programmed. For example, the normal state in a device is a state of being able to receive a level of a reception signal in an accurate behaviour, perform accurate processing based on the level of the received signal, and transmit the signal to a next destination without any information error or omission. A state referred to as "the semiconductor device 1 being in a failure state" is a state in which at least one device included in the semiconductor device 1 has a problem such as not being able to accurately receive, process, and/or transmit a signal. For example, a device in a failure state transmits a signal with wrong information to a next destination, such as transmitting an "L" level signal regardless of the reception signal received.

[1] First Embodiment

[1-1] Configuration

FIG. 1 illustrates functional blocks in a system 100 according to a first embodiment. The system 100 can be realized as, for example, a vehicle. As illustrated in FIG. 1, the system 100 includes a communication module 200, and a controller 300. The controller 300 controls, for example, other functional blocks in the system 100. If the system 100 is a vehicle, examples of other functional blocks include a brake.

The communication module 200 includes a semiconductor device 1 and a semiconductor device 2. The semiconductor device 2 is, for example, a microcomputer, and operates based on software codes (program) held in a storage medium. Based on the software codes, the semiconductor device 2 generates various control signals, and outputs the generated control signals. The control signals include signals for notifying various information items, and data.

The semiconductor device 1 receives the control signals from the semiconductor device 2. The semiconductor device 1 conducts operation based on the control signals.

The semiconductor device 1 performs processing on the control signals as necessary. The semiconductor device 1 generates an alarm signal based on the control signals and/or the state of the semiconductor device 1. The semiconductor device 1 outputs the alarm signal.

The controller 300 receives the alarm from the semiconductor device 1. Upon receipt of the alarm signal, the controller 300 controls other functional blocks based on the alarm signal.

Figure 2:
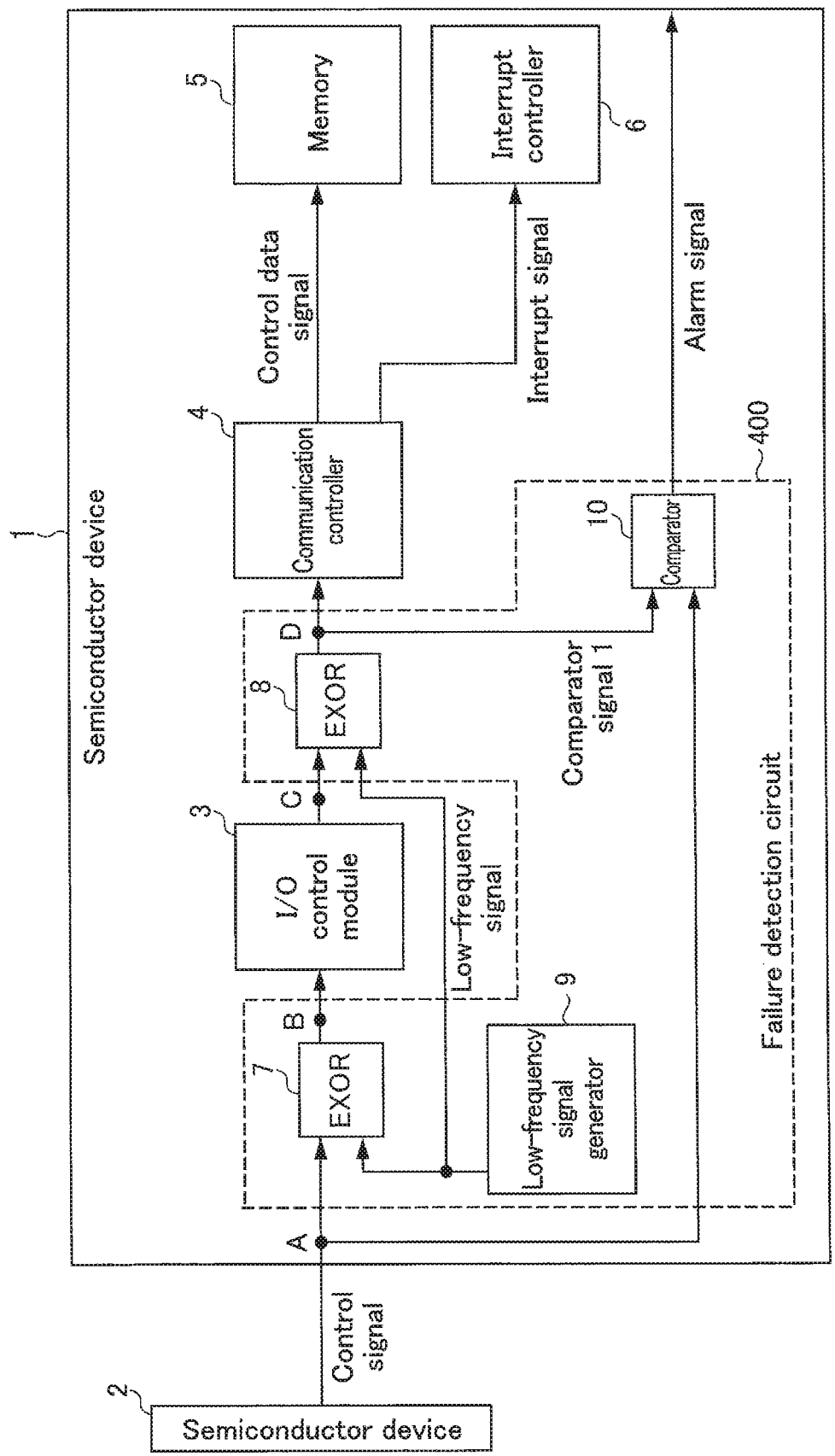
FIG. 2 illustrates functional blocks in a semiconductor device 1 according to the first embodiment.

FIG. 2 illustrates functional blocks in the semiconductor device 1 according to the first embodiment.

As illustrated in FIG. 2, the semiconductor device 1 includes a I/O control module 3, a communication controller 4, a memory 5, an interrupt controller 6, exclusive OR (EXOR) gates 7 and 8, a low-frequency signal generator 9, and a comparator 10. The semiconductor device 1 further includes nodes A, B, C, and D. The EXOR gates 7 and 8, the low-frequency signal generator 9, and the comparator 10 function as a failure detection circuit 400.

Hereinafter, a function of each component in the semiconductor device 1 will be described. The EXOR gate includes a first input terminal, a second input terminal, and an output terminal. The EXOR gate outputs an exclusive OR of a level of a signal received at the first input terminal and a level of a signal received at the second input terminal. The EXOR gate 7 is coupled at the first input terminal to the node A. The node A is coupled to the semiconductor device 2, and transmits the control signal from the semiconductor device 2. The output terminal of the EXOR gate 7 is coupled to the node B.

The I/O control module 3 is coupled at the input terminal to the node B. The I/O control module 3 performs simple processing as necessary on the signal received at the input terminal. The processing performed by the I/O control module 3 includes, for example, inversion of a signal level. The I/O control module 3 outputs a signal generated based on the processing. As far as the first embodiment and later-described embodiments are concerned, the I/O control module 3 outputs the signal received at the input terminal as it is. The output terminal of the I/O control module 3 is coupled to the node C.

The EXOR gate 8 is coupled at the first input terminal to the node C.

The low-frequency signal generator 9 receives a clock signal (not shown), and generates a low-frequency signal based on the clock signal. The low-frequency signal is a signal whose level changes periodically. The low-frequency signal is supplied to the second input terminal of the EXOR gate 7 and the second input terminal of the EXOR gate 8. The output terminal of the EXOR gate 8 is coupled to the node D.

The communication controller 4 is coupled at the input terminal to the node D. The communication controller 4 generates various signals and data based on the signal received as the input terminal. Furthermore, the communication controller 4 extracts control data from the received signal. The communication controller 4 performs determination on the received signal, and generates an interrupt signal based on a result of determination. The interrupt signal is generated, for example, when the signal received at the input terminal contains an error.

The memory 5 receives the control data from the communication controller 4. The control data is used, for example, by other functional blocks in the system 100.

The interrupt controller 6 receives the interrupt signal from the communication controller 4. The interrupt controller 6 controls interrupt processing in the system 100 based on the interrupt signal.

The comparator 10 is coupled at the first input terminal to the node D, and coupled at the second input terminal to the node A. The comparator 10 receives a signal (comparator signal 1) at the first input terminal, and receives the control signal at the second input terminal. The comparator 10 compares the comparator signal 1 and the control signal. The comparator 10 outputs a signal based on the result of comparison. The output signal functions as an alarm signal. The comparator 10 outputs an "L" level alarm signal when the levels of the comparator signal 1 and the control signal are always the same. In contrast, the comparator 10 outputs an "H" level alarm signal when it is detected that the comparator signal 1 and the control signal have different levels. Once it is detected that the comparator signal 1 and the control signal have different levels, a value indicative of detection of mismatch (e.g., "H" level) is held in an internal latch circuit. Then, the comparator 10 continues to output the "H" level alarm signal while "H" level is held by the internal latch circuit. Thus, after the alarm signal rises to "H" level, the alarm signal is always at "H" level. For example, until the alarm signal is canceled, the alarm signal is always at "H" level, and does not depend on levels of the comparator signal 1 and the control signal.

[1-2] Timing Chart of Each Signal

Hereinafter, a description will be given of an example of a timing chart of each signal in the semiconductor device 1 according to the first embodiment. During each operation, the semiconductor device 1 according to the first embodiment provides the timing chart described below.

[1-2-1] in Normal State and when not in Operation

Figure 3:
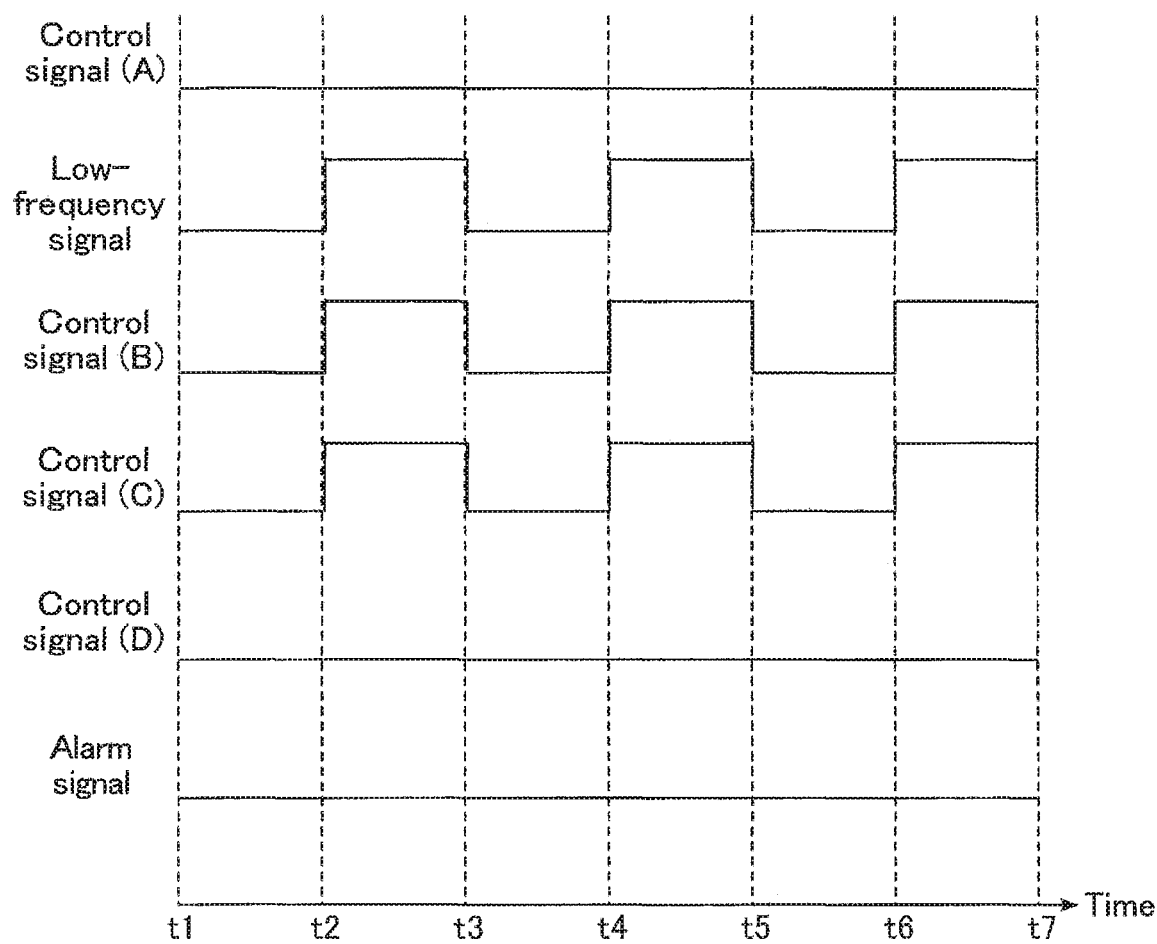
FIG. 3 illustrates an example of a timing chart of each signal when the semiconductor device 1 according to the first embodiment is in a normal state and not in operation.

FIG. 3 illustrates an example of a timing chart of each signal when the semiconductor device 1 according to the first embodiment is in a normal state and not in operation. In FIG. 3, control signal (A), control signal (B), control signal (C), and control signal (D) indicate signals of node A, node B, node C, and node D of FIG. 2, respectively.

The control signal (A) is always at "L" level because the semiconductor device 1 is not in operation.

The low-frequency signal is a signal in which "L" level and "H" level are repeated periodically. In the example of FIG. 3, one cycle of the low-frequency signal is from time t1 to time t3, and the low-frequency signal maintains "L" level from time t1 to time t2 and maintains "H" level from time t2 to time t3. Each of the period from time t1 to time t2 and the period from time t2 to time t3 is half of the period from time t1 to time t3.

Furthermore, each of the period from time t3 to time t5 and the period from time t5 to time t7 is the same as the period from time t1 to time t3, and is a period of one cycle. The period from time t3 to time t4 is half of the period from time t3 to time t5. The period from time t5 to time t6 is half of the period from time t5 to time t7.

The control signal (B) has the same level as the level of the low-frequency signal. This is because the EXOR gate 7 transmits the exclusive OR of the levels of the received control signal (A) and low-frequency signal as the control signal (B). From time t1 to time t2, the control signal (A) is at "L" level and the low-frequency signal is "L" level; therefore, the EXOR gate 7 transmits the "L" level control signal (B). From time t2 to time t3, the control signal (A) is at "L" level and the low-frequency signal is "H" level; therefore, the EXOR gate 7 transmits the "H" level control signal (B). Since this is repeated periodically, the control signal (B) has the same level as the level of the low-frequency signal.

The control signal (C) is the same as the control signal (B) and the low-frequency signal. Since FIG. 3 illustrates an example in which the I/O control module 3 operates correctly, the control signal (C) has the same level as the level of the received control signal (B).

The control signal (D) is always at "L" level. This is because the EXOR gate 8 transmits the exclusive OR of the levels of the received control signal (C) and low-frequency signal as the control signal (D). As described above, the control signal (C) and the low-frequency signal are the same. Specifically, from time t1 to time t2, the control signal (C) is at "L" level and the low-frequency signal is "L" level; therefore, the EXOR gate 8 transmits the "L" level control signal (D). From time t2 to time t3, the control signal (C) is at "H" level and the low-frequency signal is "H" level; therefore, the EXOR gate 8 transmits the "L" level control signal (D). Since this is repeated periodically, the control signal (D) is a signal always at "L" level. In this manner, in the example in which the semiconductor device 1 is not in operation and the I/O control module 3 operates normally, the control signal (D) has the same level as the level of the control signal (A).

The alarm signal is always at "L" level. As described above, this is because the control signal (A) and the control signal (D) are always at the same level, and the comparator 10 transmits the alarm signal always at "L" level. That is, when the semiconductor device 1 according to the first embodiment is in a normal state and not in operation, the alarm signal is always at "L" level.

[1-2-2] in Normal State and when Starting Communication

Figure 4:
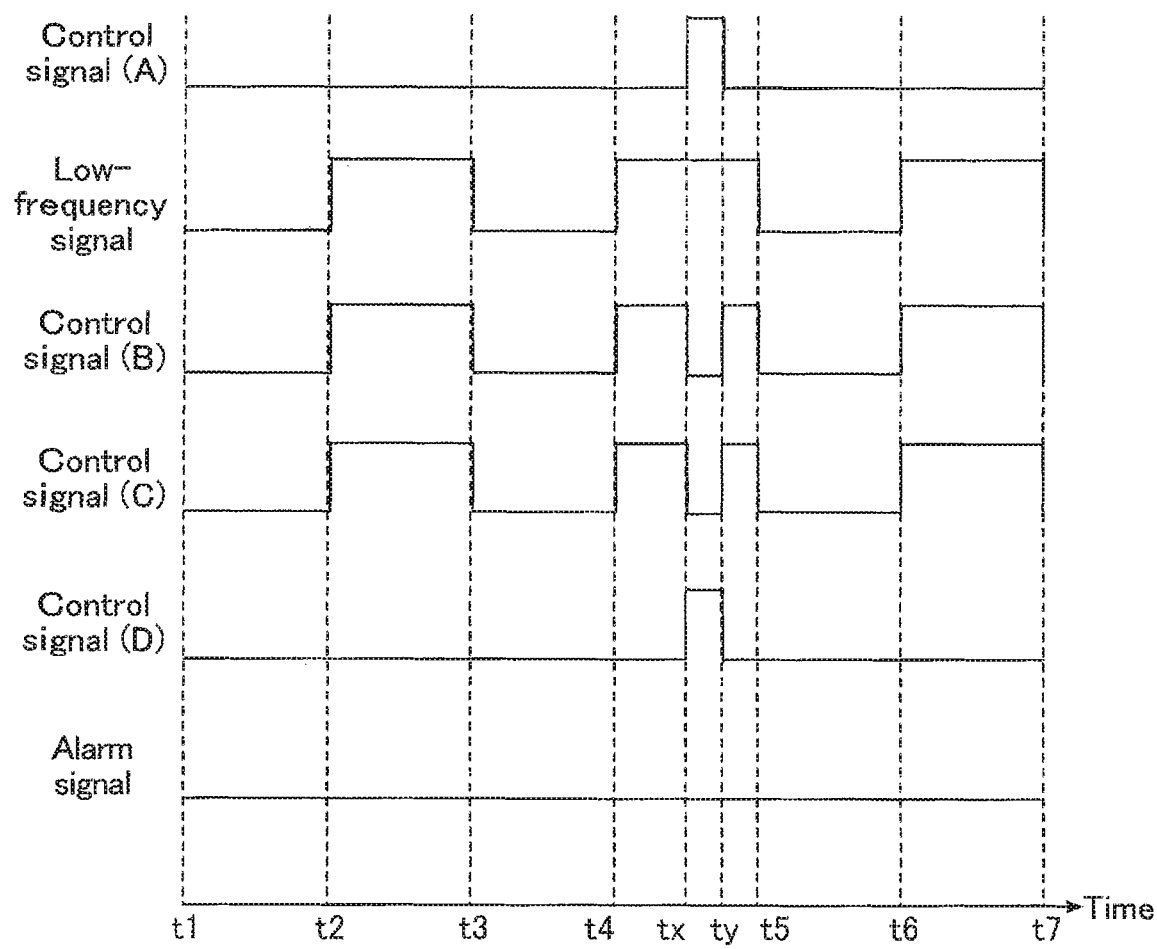
FIG. 4 illustrates an example of a timing chart of each signal when the semiconductor device 1 according to the first embodiment is in a normal state and has started communication.

FIG. 4 illustrates an example of a timing chart of each signal when the semiconductor device 1 according to the first embodiment is in a normal state and has started communication. In FIG. 4, control signal (A), control signal (B), control signal (C) and control signal (D) indicate signals similar to those of FIG. 3. Times t1 to t7 in FIG. 4 indicate times similar to those of FIG. 3.

The control signal (A) maintains "H" level from time tx to time ty, and maintains "L" level in the other periods. Time tx is an intermediate time between time t4 and time t5. Time ty is an intermediate time between time tx and time t5. The period from time tx to time ty is a quarter of the period from t4 to t5. The "H" level signal from time tx to time ty is referred to as an activation signal. The activation signal provides notification of the start of data transmission.

The low-frequency signal is similar to that of FIG. 3.

The control signal (B) maintains "L" level from time tx to time ty, and is the same as the low-frequency signal in the other periods. This is because, as in FIG. 3, the EXOR gate 7 transmits the exclusive OR of the levels of the received control signal (A) and low-frequency signal as the control signal (B). From time tx to time ty, the control signal (A) is at "H" level and the low-frequency signal is at "H" level; therefore, the EXOR gate 7 transmits the "L" level control signal (B). In periods other than the period from time tx to time ty, the EXOR gate 7 transmits the control signal (B) as in FIG. 3, and the control signal (B) has the same level as the level of the low-frequency signal.

The control signal (C) has the same level as the levels of the control signal (B) and low-frequency signal. Since FIG. 4 illustrates an example in which the I/O control module 3 operates normally as in FIG. 3, the control single (C) has the same level as the level of the received control signal (B).

The control signal (D) maintains "H" level from time tx to time ty, and maintains "L" level in the other periods. This is because the EXOR gate 8 transmits the exclusive OR of the levels of the received control signal (C) and low-frequency signal as the control signal (D). As described above, the control signal (C) and the low-frequency signal are the same in periods other than the period from time tx to time ty. Specifically, from time tx to time ty, the control signal (C) is at "H" level and the low-frequency signal is at "H" level; therefore, the EXOR gate 8 transmits the "L" level control signal (D). In periods other than the period from time tx to time ty, the EXOR gate 8 transmits the control signal (D) as in FIG. 3, and the control signal (D) maintains "L" level. In this manner, in the example in which the semiconductor device 1 has started communication and the I/O control module 3 operates normally, the control signal (D) has the same level as the level of the control signal (A).

The alarm signal is always at "L" level. As described above, this is because the control signal (A) and the control signal (D) are always at the same level and therefore the comparator 10 transmits the alarm signal always at "L" level. That is, when the semiconductor device 1 according to the first embodiment is in a normal state and has started communication, the alarm signal is always at "L" level. As is apparent from the above description, in addition to the communication start time, during the period when the semiconductor device 1 is in a normal state, the control signal (D) has the same level as the level of the control signal (A), and the alarm signal is always at "L" level.

[1-2-3] in Failure State and when not in Operation

Figure 5:
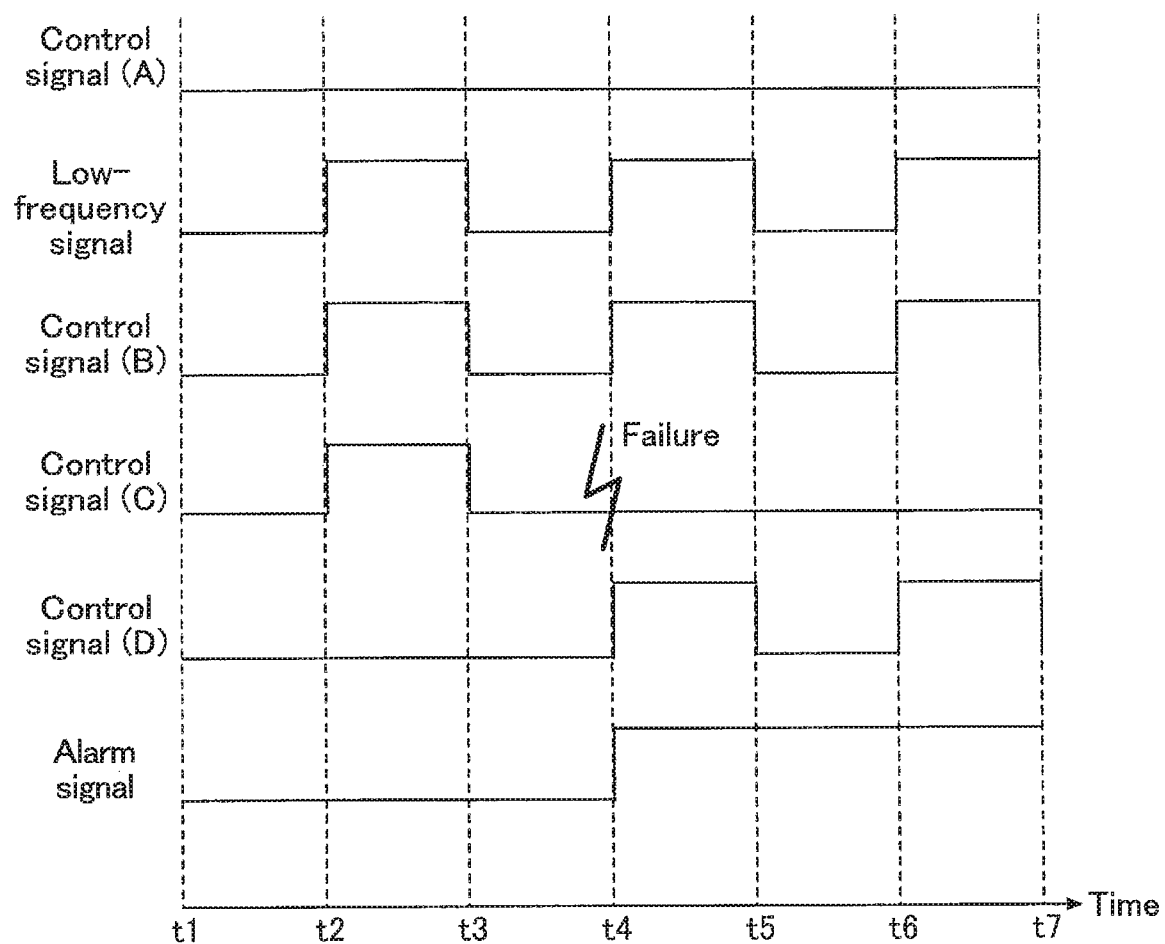
FIG. 5 illustrates an example of a timing chart of each signal when the semiconductor device 1 according to the first embodiment is in a failure state and not in operation.

FIG. 5 illustrates an example of a timing chart of each signal when the semiconductor device 1 according to the first embodiment is in an failure state and not in operation. The failure state in the first embodiment is a state in which the I/O control module 3 of FIG. 2 fails at time t4 (described below), and the signal at the normal level cannot be transmitted correctly. In FIG. 5, control signal (A), control signal (B), control signal (C) and control signal (D) indicates signals similar to those of FIG. 3. Times t1 to t7 in FIG. 4 indicate times similar to those of FIG. 3.

Each signal is transmitted in the same behaviour as in the normal state of FIG. 3 until reaching the I/O control module 3 where a failure occurs.

The control signal (A), the low-frequency signal, and the control signal (B) are unaffected by the failure of the I/O control module 3. Therefore, the control signal (A), the low-frequency signal, and the control signal (B) are similar to those of FIG. 3.

The control signal (C) has the same level as the level of the control signal (B) until time t4 at which the failure occurs. At and after time t4, the control signal (C) cannot transmit the level of the control signal (B) in an accurate manner, and transmits, for example, the signal always at "L" level.

Before time t4, the control signal (D) is always at "L" level and similar to that of FIG. 3. In other words, in the period when the EXOR gate 8 receives the control signal (C) correctly, the control signal (D) is always at "L" level. At and after time t4, the EXOR gate 8 transmits the exclusive OR of the levels of the received alarm signal (C) and low-frequency signal as the control signal (D). Thus, the control signal (D) is brought to "H" level in the period when the control signal (C) and the low-frequency signal are not at the same level. In this manner, in an example in which the semiconductor device 1 is not in operation and the failure has occurred in the I/O control module 3, the control signal (D) has a period when the control signal (D) has a level different from the level of the control signal (A) after the time when failure has occurred.

Before time t4, the alarm signal is always at "L" level and similar to that of FIG. 3. At and after time t4, it is always at "H" level. More precisely, after the failure occurs, it is always at "H" level after the time when the control signal (D) is first brought to "H" level (time t4 in this embodiment). As described above, this is because upon receipt of the control signal (A), and the control signal (D) having different levels, the comparator 10 transmits the alarm signal always at "H" level thereafter. That is, when the semiconductor device 1 according to the first embodiment is in a failure state and not in operation, the alarm signal has a period when it has "H" level.

[1-3] Advantages (Effects

According to the semiconductor device 1 of the first embodiment described above, even when the semiconductor device 1 is not in operation, it is possible to detect a failure of the I/O control module 3. Furthermore, it is possible to reduce an increase of a circuit scale by the failure detection circuit. Hereinafter, a detailed description of the advantages of the semiconductor device 1 according to the first embodiment will be given.

A semiconductor device mounted on, for example, a vehicle, undertakes important roles such as operating based on the control signal and performing processing on the control signal as necessary. Thus, if a device constituting the semiconductor device fails, it is important in terms of maintaining the system to detect failure promptly and work on another device, which also leads to suppression of secondary damages.

However, if the semiconductor device 1 does not have a failure detection device, failure detection cannot be conducted, and the system may not be controlled. This case will be described with reference to FIGS. 6 to 8. FIG. 6 illustrates functional blocks in a semiconductor device 1 according to a comparative example of the first embodiment. As illustrated in FIG. 6, the semiconductor device 1 does not have a failure detection device. The semiconductor device 1 includes an I/O control module 3, a communication controller 4, a memory 5, and an interrupt controller 6. The I/O control module 3 is coupled at an input terminal to a node A. An output terminal of the I/O control module 3 is coupled to a node B. The communication controller 4 is coupled at an input terminal to the node B.

Figure 7:
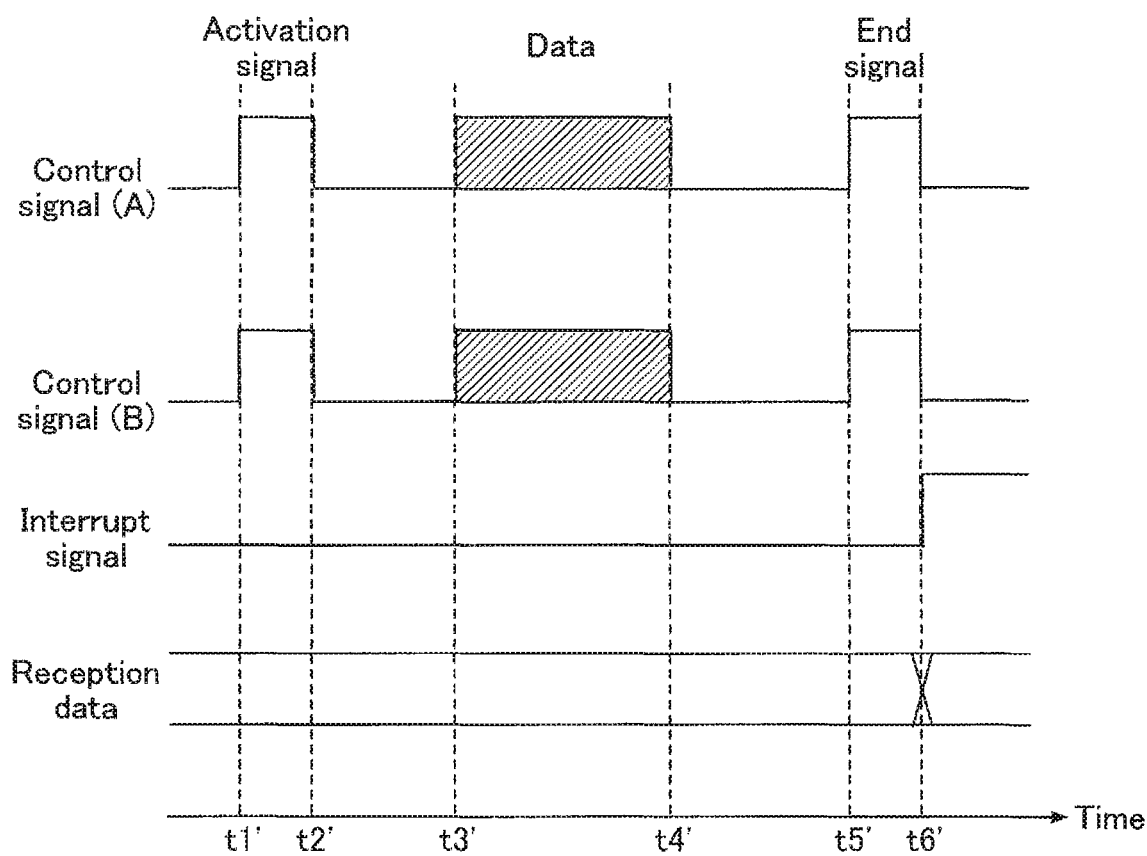
FIG. 7 illustrates an example of a timing chart of each signal when the semiconductor device 1 according to the comparative example of the first embodiment is in a normal state and has started communication.

FIG. 7 illustrates an example of a timing chart of each signal when the semiconductor device 1 according to the comparative example of the first embodiment is in a normal state and has started communication. In FIG. 7, control signal (A) and control signal (B) indicate signals of the node A and node B, respectively, of FIG. 6.

The control signal (A) maintains "H" level from time t1' to time t2'. The "H" level signal from time t1' to time t2' is an activation signal. The activation signal, for example, makes a notification that data starts to flow after a certain period has elapsed after the activation signal.

The control signal (A) has "H" level and "L" level in various combinations from time t3' to time t4' according to contents of data.

The control signal (A) maintains "H" level from time t5' to time t6'. The "H" level signal from time t5' to time t6' is an end signal. The end signal, for example, provides a notification that data transmission ends by flowing after a certain period has elapsed after the data is transmitted.

Since FIG. 7 illustrates an example in which the I/O control module 3 operates normally, the control signal (B) has the same level as the level of the received control signal (A).

Reception data is the same as data received at the communication controller 4, and starts to be output from time t6'.

As can be seen from FIG. 7, if the semiconductor device 1 is not operating even in a normal state, the control signal (A) always have "L" level.

Figure 8:
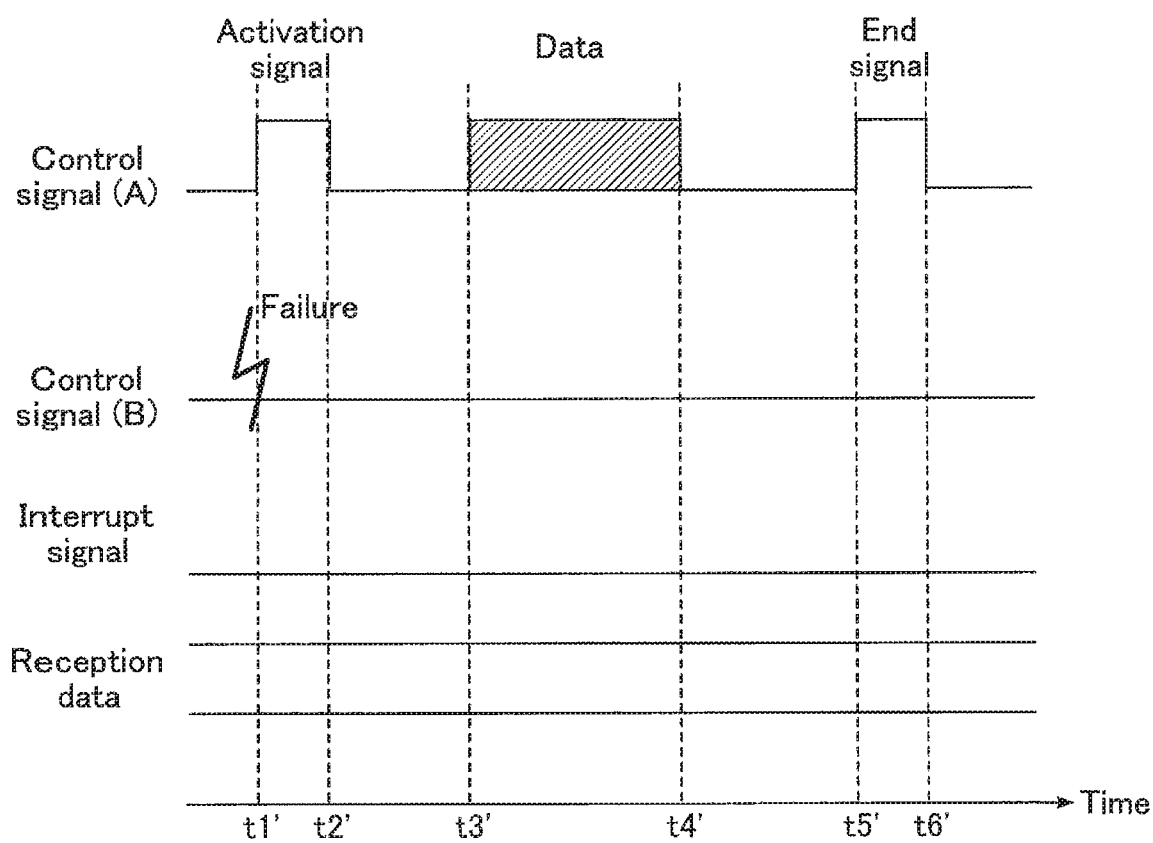
FIG. 8 illustrates an example of a timing chart of each signal when the semiconductor device 1 according to the comparative example of the first embodiment is in a failure state and has started communication.

FIG. 8 illustrates an example of a timing chart of each signal when the semiconductor device 1 according to the comparative example of the first embodiment is in a failure state and has started communication. The failure state in the comparative example of the first embodiment is a state in which the I/O control module 3 of FIG. 6 fails at time t1' and cannot transmit the signal of the normal level correctly.

Each signal is transmitted in the same behavior as in the normal state of FIG. 3 until reaching the I/O control module 3 where a failure occurs.

The control signal (A) is unaffected by the failure of the I/O control module 3. Thus, the control signal (A) is similar to that of FIG. 7. At and after time t1', the control signal (B) cannot transmit the level of the control signal (A) correctly, and always has the "L" level, for example. The reception data receives no data at and after time t1'. This is because the communication controller 4 receives the control signal (B) always at "L" level at and after time t1', and cannot receive the activation signal or the end signal.

As described above, in the semiconductor device 1 according to the comparative example of the first embodiment, if the I/O control module 3 fails, the signal after the time of failure may not be transmitted correctly. In order to avoid this, the duplicated circuit or periodic diagnosis by software may be conducted to detect a failure.

However, the duplicated circuit or periodic diagnosis by software may incur problems: an increase in circuit scale, and such as poor performance caused by an increase in software load. Furthermore, circuit duplication or periodic diagnosis by software cannot detect a failure if the semiconductor device 1 is not operating. That is, it is not possible to distinguish between the control signal (B) staying at "L" level due to a failure of the I/O control module 3, and the control signal (B) staying at "L" level because the semiconductor device 1 is not in operation even though the I/O control module 3 is in a normal state. If a failure is discovered at the operating stage, it may be difficult to deal with the failure.

In contrast, the semiconductor device 1 according to the first embodiment includes the EXOR gates 7 and 8, and the low-frequency signal generator 9. The control signal (B) input into the I/O control module 3 is the exclusive OR of the low-frequency signal from the low-frequency signal generator 9 and the control signal (A). Thus, the control signal (B) has a level that changes periodically even during the period when the control signal (A) stays always at "L" level due to the semiconductor device 1 not being in operation, and has the same level as the low-frequency signal. The control signal (C) from the I/O control module 3 and the low-frequency signal are compared by the EXOR gate 8. When the semiconductor device 1 is not in operation and the I/O control module 3 is in a normal state, the control signal (C) and the low-frequency signal should have the same level. On the other hand, when the semiconductor device 1 is not in operation and the I/O control module 3 fails, the control signal (C) and the low-frequency signal should have different levels. By detecting a mismatch between the levels of the control signal (C) and the low-frequency signal, a failure of the I/O control module 3 can be detected even when the semiconductor device 1 is not in operation.

Furthermore, the only components added to detect a failure are the EXOR gates 7 and 8 and the low-frequency signal generator 9. This configuration saves a space as compared to when the circuit is duplicated. Therefore, the first embodiment allows for a failure detection in a smaller space.

As a result, the semiconductor device 1 according to the first embodiment can perform failure detection even when the device is not in operation, and can reduce an increase of circuit scale by the failure detection circuit. Therefore, the semiconductor device 1 according to the first embodiment can reduce risks by a failure.

[2] Second Embodiment

[2-1] Configuration

A semiconductor device 1 according to the second embodiment relates to a case where EXOR gates 7 and 8 are distant.

In the second embodiment, the semiconductor device 1 has a structure in which a plurality of low-frequency signal generators are provided. The rest of the structure is approximately the same as in the first embodiment. Hereinafter, the points of difference between the semiconductor device 1 according to the second and first embodiments will be described.

FIG. 9 illustrates functional blocks in the semiconductor device 1 according to the second embodiment. FIG. 9 is the same as FIG. 2 except that a low-frequency signal generator 11 is added. However, in the second embodiment, it is assumed that interconnects of nodes B and C are long. EXOR gates 7 and 8, low-frequency signal generators 9 and 11, and a comparator 10 function as a failure detection circuit 500. In the semiconductor device 1 according to the first embodiment, the low-frequency signal is transmitted from a single low-frequency signal generator 9 to the EXOR gates 7 and 8. In contrast, in the semiconductor device 1 according to the second embodiment, the low-frequency signal is transmitted from the low-frequency signal generator 9 to the EXOR gate 7, and from the low-frequency signal generator 11 to the EXOR gate 8.

FIG. 10 illustrates an example of transmission of a clock signal of the semiconductor device 1 according to the second embodiment. The semiconductor device 1, for example, receives a clock signal from an outside, and generates an internal clock signal of various frequencies from the received clock signal. The generated internal clock signal is supplied to a circuit requiring an internal clock signal. The clock signal may cause a delay in the course of transmission. On the other hand, a plurality of circuits that operate at the same timing, i.e., operate through synchronization, are required to receive clock signals whose levels change at the same timing. A range in which clock signals whose levels change at the same timing are supplied is called a clock domain.

As illustrated in FIG. 10, in the semiconductor device 1 according to the second embodiment, the low-frequency signal generator 9 and 11 are located in the same clock domain CD1. Therefore, the low-frequency signal from the low-frequency signal generator 9 and the low-frequency signal from the low-frequency signal generator 11 are synchronized and have the levels that change substantially at the same timing. The semiconductor device 1 may include other clock domains CD2, CD3, CD4, etc.

[2-2] Timing Chart of Each Signal

Figure 11:
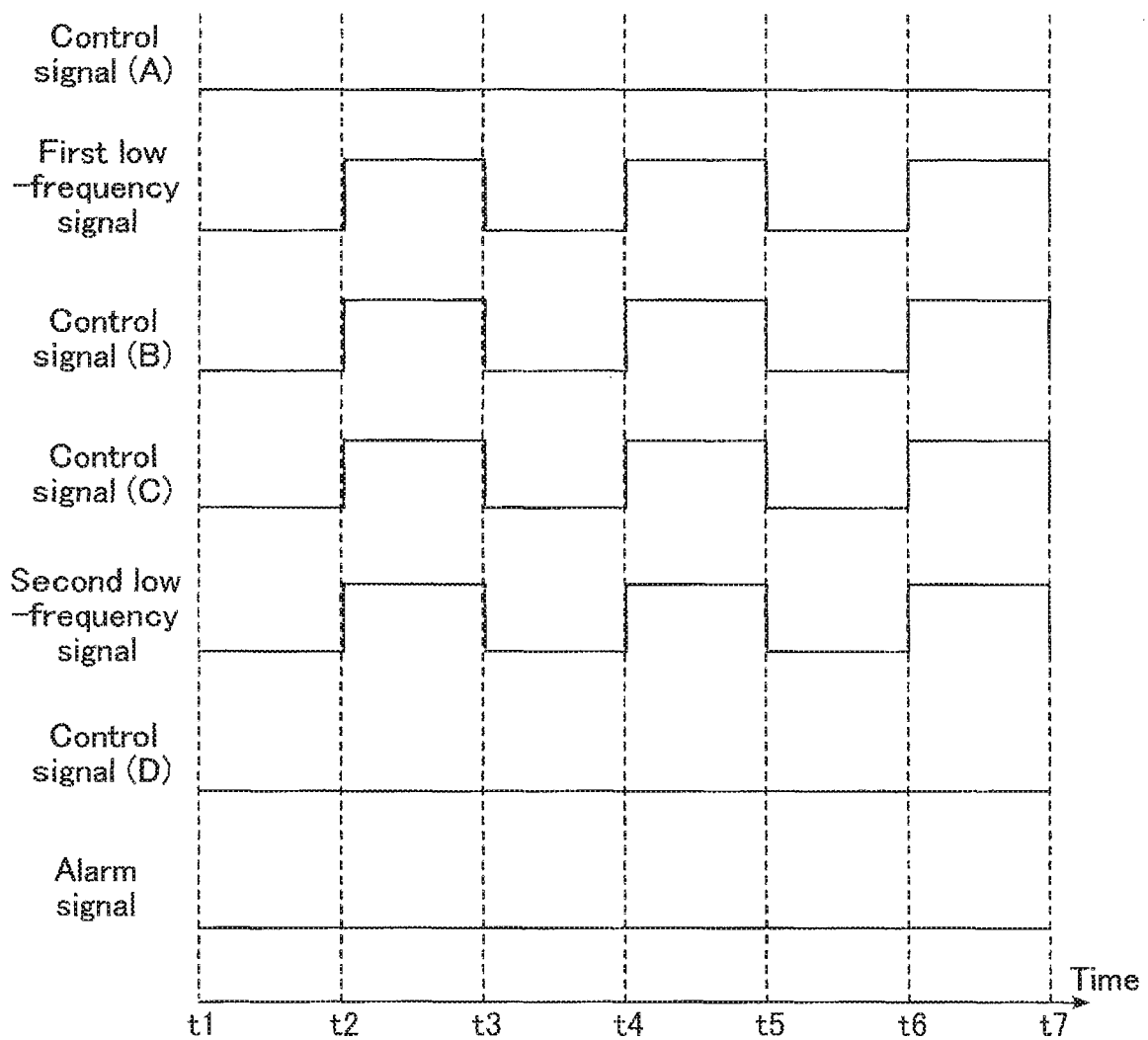
FIG. 11 illustrates an example of a timing chart of each signal when the semiconductor device 1 according to the second embodiment is in a normal state and not in operation.
Figure 12:
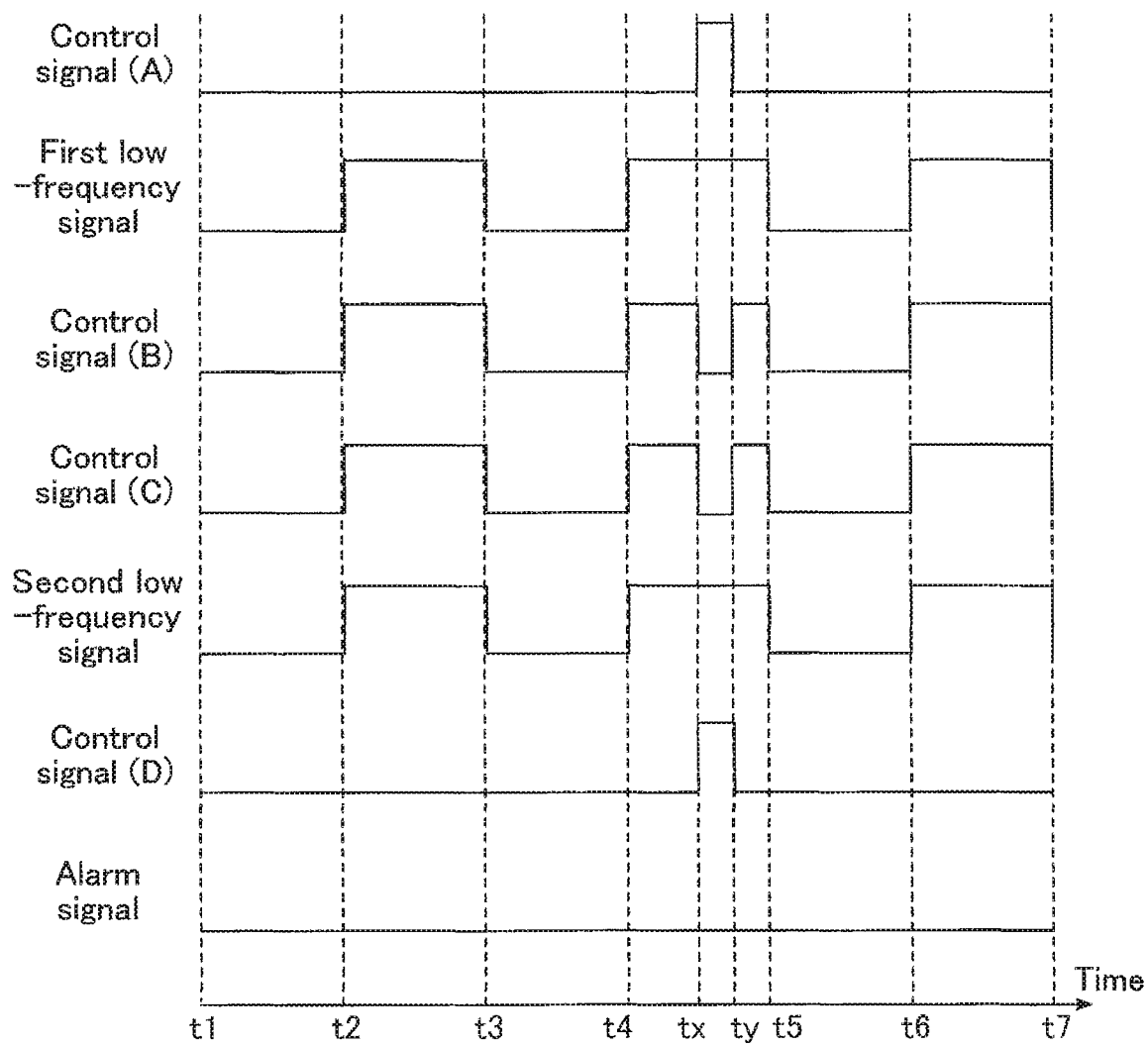
FIG. 12 illustrates an example of a timing chart of each signal when the semiconductor device 1 according to the second embodiment is in a normal state and has started communication.
Figure 13:
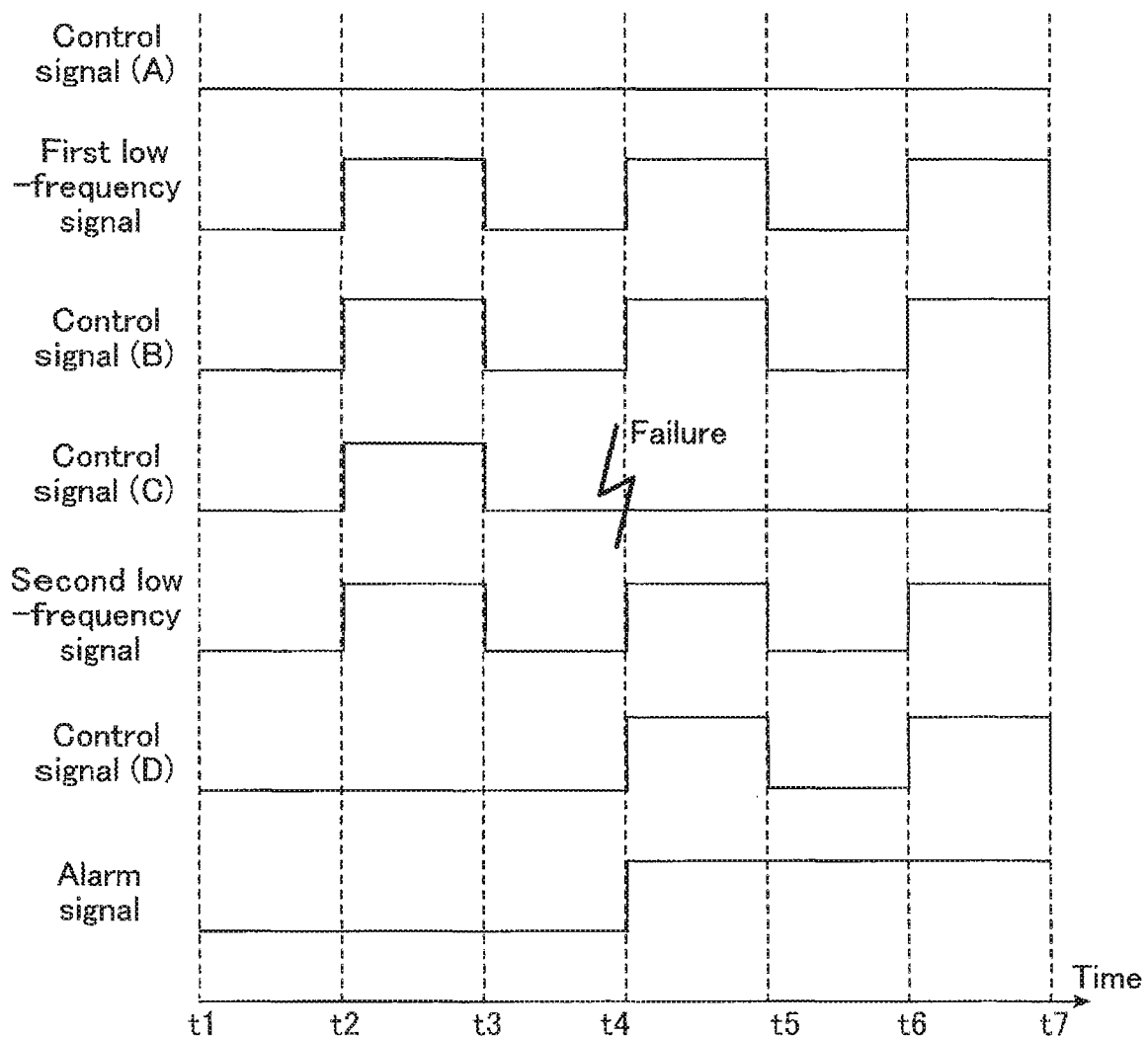
FIG. 13 illustrates an example of a timing chart of each signal when the semiconductor device 1 according to the second embodiment is in a failure state and not in operation.

Hereinafter, a description will be given of an example of a timing chart of each signal in the semiconductor device 1 according to the second embodiment. During each operation, the semiconductor device 1 according to the second embodiment provides the timing charts as in FIGS. 11 to 13. In FIGS. 11 to 13, control signal (A), control signal (B), control signal (C), control signal (D), and alarm signal indicate signals similar to those of FIG. 3. A low-frequency signal in FIGS. 11 to 13 (signal output from the low-frequency signal generator 9) is similar to that in FIG. 3. In FIGS. 11 to 13, times t1 to t7 indicate times similar to those of FIG. 3. In the following description, the signal output from the low-frequency signal generator 9 may be referred to as a first low-frequency signal.

FIG. 11 illustrates an example of a timing chart of each signal when the semiconductor device 1 according to the second embodiment is in a normal state and not in operation. The control signal (A), the first low-frequency signal (low-frequency signal generator 9), the control signal (B), and the control signal (C) are unaffected by addition of the low-frequency signal generator 11. Thus, the control signal (A), the first low-frequency signal, the control signal (B), and the control signal (C) each have the same levels as in FIG. 3. The low-frequency signal (signal output from the low-frequency signal generator 11) has the same level as the level of the first low-frequency signal (output from the low-frequency signal generator 9). In the following description, the signal output from the low-frequency signal generator 11 may be referred to as a second low-frequency signal. Since the second low-frequency signal (output from the low-frequency signal generator 11) has the same level as the level of the first low-frequency signal generation (output from the low-frequency signal generator 9), the control signal (D) and the alarm signal are also unaffected by addition of the low-frequency signal generator 11, and each have the same levels as in FIG. 3. Thus, because the low-frequency signal generator 11 added in the second embodiment functions in the same manner as the low-frequency signal generator 9, the timing chart of each signal is similar to that in the first embodiment (FIG. 3). That is, when the semiconductor device 1 according to the second embodiment is in a normal state and not in operation, the alarm signal is always at "L" level.

FIG. 12 illustrates an example of a timing chart of each signal when the semiconductor device 1 according to the second embodiment is in a normal state and has started communication. In FIG. 12, times tx and ty indicate times similar to those of FIG. 4. As in FIG. 11, since the low-frequency signal generator 11 outputs the second low-frequency signal having the level that changes at the same timing as the first low-frequency signal from the low-frequency signal generator 9, the timing chart of each signal is similar to that in the first embodiment (FIG. 4). That is, in addition to the communication start time, during the period when the semiconductor device 1 is in a normal state, the control signal (D) has the same level as the level of the control signal (A), and the alarm signal is always at "L" level.

FIG. 13 illustrates an example of a timing chart of each signal when the semiconductor device 1 according to the second embodiment is in a failure state and not in operation.

As in FIG. 11, since the low-frequency signal generator 11 outputs the second low-frequency signal having the level that changes at the same timing as the first low-frequency signal from the low-frequency signal generator 9, the timing chart of each signal is similar to that in the first embodiment (FIG. 5). In this manner, failure can be detected. That is, when the semiconductor device 1 according to the second embodiment is in a failure state and not in operation, the alarm signal has a period when it has "H" level.

[2-3] Advantages (Effects

According to the semiconductor device 1 of the second embodiment described above, even when the EXOR gates 7 and 8 of the semiconductor device 1 are distant, the same advantage as that of the first embodiment can be provided.

As described in the first embodiment, the reason why a failure of the I/O control module 3 can be detected even when the semiconductor device 1 is not in operation is that the level of the low-frequency signal passing through the I/O control module 3 through the EXOR gate 7 and the level of the low-frequency signal not input into the I/O control module 3 are compared to check for a difference therebetween. That is, it is based on the assumption that the level of the low-frequency signal input into the I/O control module 3 matches the level of the low-frequency signal not input into the I/O control module 3.

For example, if the semiconductor device 1 has a large circuit area and the EXOR gates 7 and 8 are distant, a delay may be caused due to a longer transmission distance of the low-frequency signal generated from a certain single low-frequency signal generator. The cause of delay may result in a deviation of a timing of the switching of "L" level and "H" level of the low-frequency signals received at the EXOR gates 7 and 8. If the timing of the switching levels deviates, even though the I/O control module 3 operates normally, the alarm signal may be brought to "H" level, resulting in a wrong failure detection.

In contrast, because the semiconductor device 1 according to the second embodiment includes the plurality of low-frequency signal generator 9 and 11 located in the same clock domain CD1, it is possible to determine the level of the control signal correctly even when the circuit scale is large.

Specifically, when the semiconductor device 1 according to the second embodiment includes the low-frequency signal generators 9 and 11, it is possible to arrange the low-frequency signal generators 9 and 11 in the vicinity of the EXOR gates 7 and 8, respectively. Therefore, the EXOR gates 7 and 8 can receive the first and second low-frequency signals with less of a delay from the low-frequency signal generators 9 and 11. Since the low-frequency signal generators 9 and 11 are located in the same clock domain CD1, even when distant, the low-frequency signal generators 9 and 11 can receive low-frequency signals of levels that change substantially at the same timing. This may prevent a deviation of the timing of the switching of "L" level and "H" level of the low-frequency signals received by the EXOR gates 7 and 8. Thus, if the EXOR gates 7 and 8 are distant, it is possible to detect failure of the I/O control module 3 correctly.

As described above, the semiconductor device 1 according to the second embodiment can achieve the same advantages as those of the first embodiment even when the semiconductor device 1 has a large circuit scale.

[3] Third Embodiment

[3-1] Configuration

The semiconductor device 1 according to the third embodiment relates to a case where a failure detection circuit similar to that of the first embodiment is applied to an internal signal of device such as an interrupt signal.

In the semiconductor device 1 of the third embodiment, if the failure detection circuit similar to that of the first embodiment is applied to the interrupt signal, a comparator and an alarm signal are, unlike as in other embodiments, rendered unnecessary. Hereinafter, the points of difference between the semiconductor device 1 according to the third and first embodiments will be described. FIG. 14 illustrates functional blocks in a semiconductor device 1 according to the third embodiment. The structure is similar to that in FIG. 2 except that a failure detection circuit 500 is applied to the interrupt signal and no comparator is included. As illustrated in FIG. 14, the semiconductor device 1 includes a I/O control module 3, a communication controller 4, a memory 5, an interrupt controller 6, EXOR gates 7 and 8, and a low-frequency signal generator 9. The semiconductor device 1 further includes nodes A, B, C, and D. The EXOR gates 7 and 8 and the low-frequency signal generator 9 function as a failure detection circuit 600.

The I/O module 3 is coupled at an input terminal to the semiconductor device 2. The communication controller 4 is coupled at an input terminal to an output terminal of the I/O control module 3. The communication controller 4 outputs control data from a first output terminal. The communication controller 4 outputs an interrupt signal from a second output terminal. The communication controller 4 is coupled at the second output terminal to the node A. The communication controller 4 performs determination on the received signal, and generates an interrupt signal based on a result of determination. For example: by receiving an "H" level signal and detecting interruption, the communication controller 4 sets an interrupt flag inside the communication controller 4. The memory 5 receives the control data from the communication controller 4.

The EXOR gate 7 is coupled at the first input terminal to the node A. The node A is coupled to the communication controller 4 and transmits the interrupt signal. The output terminal of the EXOR gate 7 is coupled to the node B. The nodes B and C are coupled. The EXOR gate 8 is coupled at the first input terminal to the node C. The low-frequency signal generator 9 generates a low-frequency signal. The low-frequency signal is supplied to the second input terminal of the EXOR gate 7 and the second input terminal of the EXOR gate 8. The output terminal of the EXOR gate 8 is coupled to the node D. The interrupt controller 6 is coupled at the input terminal to the node D. For example: by receiving an "H" level interrupt signal and detecting interruption, the interrupt controller 6 reads the interrupt flag of the communication controller 4. If no interrupt flag is set in the communication controller 4 even when the interrupt controller 6 detects interruption, it is confirmed that a failure has occurred in the interrupt signal.

[3-2] Timing Chart of Each Signal

Figure 17:
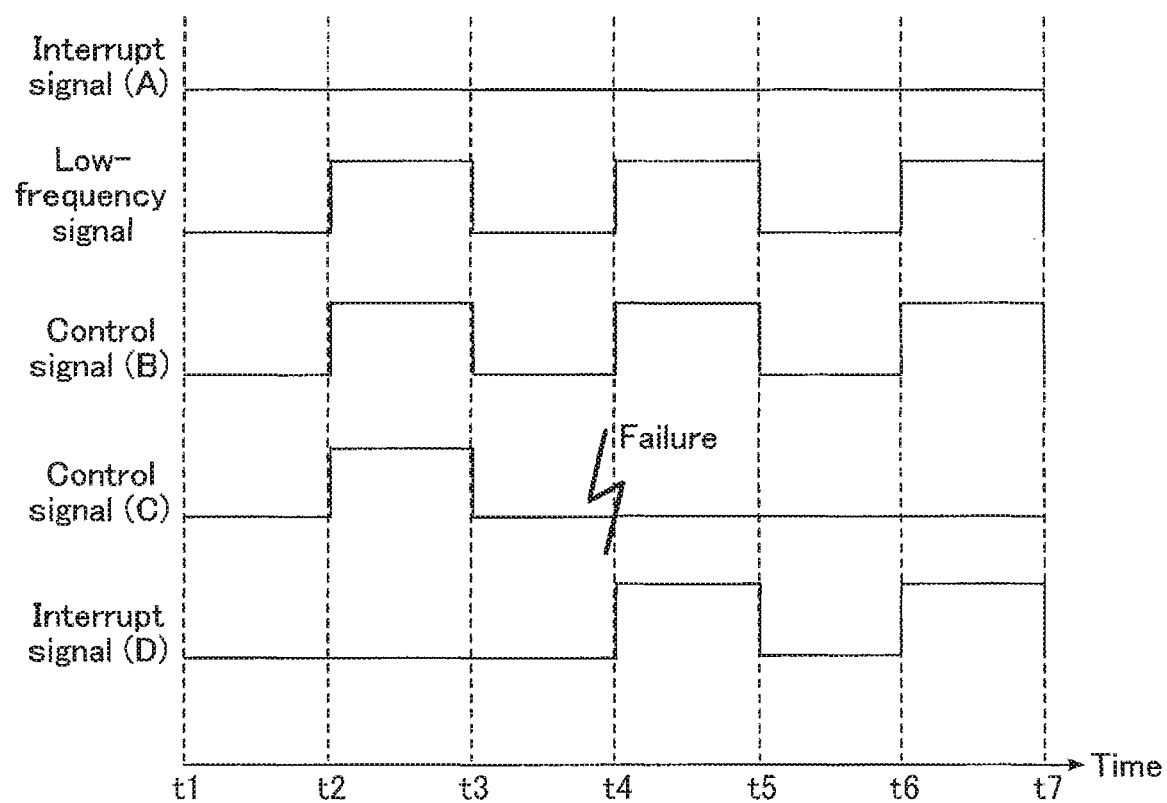
FIG. 17 illustrates an example of a timing chart of each signal when the semiconductor device 1 according to the third embodiment is in a failure state and not in operation.

Hereinafter, a description will be given of an example of a timing chart of each signal in the semiconductor device 1 according to the third embodiment. During each operation, the semiconductor device 1 according to the third embodiment exhibits the timing charts as in FIGS. 15 to 17. In FIGS. 15 to 17, interrupt signal (A), control signal (B), control signal (C), and interrupt signal (D) indicate signals of node A, node B, node C, and node D of FIG. 14, respectively. The low-frequency signal in FIGS. 15 to 17 is similar to that of FIG. 3. Times t1 to t7 in FIGS. 15 to 17 are similar to those of FIG. 3.

[3-2-1] in Normal State and when not in Operation

FIG. 15 illustrates an example of a timing chart of each signal when the semiconductor device 1 according to the third embodiment is in a normal state and not in operation. The normal state in the third embodiment is a state in which a normal operation is performed at least between nodes B and C of FIG. 14.

The interrupt signal (A) is always at "L" level because the semiconductor device 1 is not in operation.

The control signal (B) has the same level as the level of the low-frequency signal. As in the control signal (B) of the first embodiment, this is because the EXOR gate 7 transmits the exclusive OR of the levels of the received interrupt signal (A) and low-frequency signal as the control signal (B).

The control signal (C) is the same as the control signal (B) and the low-frequency signal. Since FIG. 15 illustrates an example in which the normal operation is performed between the nodes B and C, the control signal (C) has the same level as the level of the received control signal (B).

The interrupt signal (D) is always at "L" level. As in the control signal (D) of the first embodiment, this is because the EXOR gate 8 transmits the exclusive OR of the levels of the received interrupt signal (C) and low-frequency signal as the interrupt signal (D). As described above, the control signal (C) and the low-frequency signal are the same, and the EXOR gate 8 transmits the "L" level interrupt signal (D). Because the interrupt signal (D) is always at "L" level, the interrupt controller 6 does not read the interrupt flag of the communication controller 4.

[3-2-2] in Normal State and when Starting Communication

FIG. 16 illustrates an example of a timing chart of each signal when the semiconductor device 1 according to the third embodiment is in a normal state and has started communication. FIG. 16 illustrates an example in which communication started at time tx (described below). Time tx in FIG. 16 is similar to that of FIG. 4. Before tx at which communication starts, each signal is transmitted in the same behavior as when the semiconductor device 1 is not in operation as illustrated in FIG. 15.

The interrupt signal (A) maintains "H" level at and after time tx, and maintains "L" level in the periods before time tx. The "H" level signal at and after time tx makes a notification that the communication has started.

The control signal (B) maintains "L" level from time tx to time t5. The control signal (B) maintains "H" level from time t5 to time t6. The control signal (B) maintains "L" level from time t6 to time t7. As in FIG. 15, this is because the EXOR gate 7 transmits the exclusive OR of the levels of the received interrupt signal (A) and low-frequency signal as the control signal (B). From time tx to time t5, the interrupt signal (A) is at "H" level and the low-frequency signal is at "H" level; therefore, the EXOR gate 7 transmits the "L" level control signal (B). From time t5 to time t6, the interrupt signal (A) is at "H" level and the low-frequency signal is at "L" level; therefore, the EXOR gate 7 transmits the "H"

level control signal (B). From time t6 to time t7, the interrupt signal (A) is at "H" level and the low-frequency signal is at "H" level; therefore, the EXOR gate 7 transmits the "L" level control signal (B). In this behavior, at and after time tx, the control signal (B) has an inverted level of the level of the low-frequency signal.

The control signal (C) has the same level as the level of the control signal (B). As in FIG. 15, FIG. 16 illustrates an example in which the normal operation is performed between the nodes B and C, and therefore the control signal (C) has the same level as the level of the received control signal (B). That is, the control signal (C) has the same level as the level of the low-frequency signal before time tx, and has an inverted level of that of the low-frequency signal at and after time tx.

The interrupt signal (D) maintains "H" level at and after time tx, and maintains "L" level in the periods before time tx. This is because the EXOR gate 8 transmits the exclusive OR of the levels of the received control signal (C) and low-frequency signal as the interrupt signal (D). As described above, the control signal (C) has the same level as the level of the low-frequency signal before time tx, and has an inverted level of the level of the low-frequency signal at and after time tx. Therefore, the EXOR gate 8 transmits the "L" level interrupt signal (D) before time tx, and transmits the "H" level interrupt signal (D) at and after time tx. Since the interrupt signal (D) is brought to "H" level at time tx, the interrupt controller 6 reads the interrupt flag of the communication controller 4. A time tx, an interrupt flag for starting communication is set in the communication controller 4. Thus, it is confirmed that an interruption is correctly.

In this manner, the interrupt signal (D) is the same as the control signal (B). That is, even though the failure detection circuit 600 is inserted, the control signal (B) output from the communication controller 4 can reach the interrupt controller 6 as the interrupt signal (D) in its original form.

[3-2-3] in Failure State and when not in Operation

FIG. 17 illustrates an example of a timing chart of each signal when the semiconductor device 1 according to the third embodiment is in a failure state and not in operation. The failure state in the third embodiment is a state in which there is a failure at time t4 between the nodes B and C of FIG. 14, and the signal at the normal level cannot be transmitted in an accurate behavior. Each signal is transmitted in the same behavior as in the normal state of FIG. 15 until reaching the portion between the nodes B and C where a failure has occurred.

The interrupt signal (A), the low-frequency signal, and the control signal (B) are unaffected by a failure between the nodes B and C. Therefore, the interrupt signal (A), the low-frequency signal, and the control signal (B) are similar to those of FIG. 15. Furthermore, until time tx at which a failure occurs, each signal is transmitted in the same behavior as when the semiconductor device 1 is not in operation of FIG. 15.

The control signal (C) has the same level as the level of the control signal (B) until time t4 at which a failure occurs. At and after time t4, the control signal (C) cannot transmit the level of the control signal (B) in an accurate behavior, and, for example, transmits the signal always at "L" level.

The interrupt signal (D) is always at "L" level until time t4. At and after time t4, the EXOR gate 8 transmits the exclusive OR of the levels of the received alarm signal (C) and low-frequency signal as the interrupt signal (D). Thus, the interrupt signal (D) is brought to "H" level in the period when the control signal (C) and the low-frequency signal are not at the same level. In this manner, in an example in which the semiconductor device 1 is not in operation and the failure has occurred in the I/O control module 3, the interrupt signal (D) has a period when the interrupt signal (D) has a level different from that of the interrupt signal (A) after the time when the failure has occurred. In FIG. 17, since the interrupt signal (D) is brought to "H" level at time t4, the interrupt controller 6 reads the interrupt flag of the communication controller 4. At time t4, an interrupt flag is not set in the communication controller 4. Thus, it is confirmed that a failure has occurred in the interrupt signal.

[3-3] Advantages (Effects

According to the semiconductor device 1 of the third embodiment described above, the same advantage as that of the first embodiment can be provided for the internal signal such as the interrupt signal.

As the first embodiment detects the failure of the I/O control module 3, the third embodiment detects a failure between the nodes B and C of FIG. 14. That is, the semiconductor device 1 according to the third embodiment compares the level of the low-frequency signal passing through between the nodes B and C via the EXOR gate 7 and the level of the low-frequency signal not input between the nodes B and C to check for a difference therebetween. They match when the semiconductor device 1 is in a normal state and not in operation. When they do not match, the interrupt signal (D) moves into a state in which it has "H" level. The "H" level of the interrupt signal (D) may result from a failure between the nodes B and C, or from the interrupt signal (A) being brought to "H" level. However, with the interrupt signal (D) alone, the interrupt controller 6 cannot distinguish between the failure occurring between the nodes B and C and the interrupt signal (A) being brought to "H" level.

When receiving the "H" level interrupt signal, the interrupt controller 6 confirms whether the interrupt flag is on in the communication controller 4, and determines whether the interrupt signal is correct. If the interrupt flag is on, the interrupt controller 6 finds that the interrupt signal (A) is brought to "H" level. On the other hand, if the interrupt flag is off, the interrupt controller 6 finds that a failure has occurred between the nodes B and C. In this manner, it is possible to detect failure of the interrupt signal between the nodes B and C.

As described above, the semiconductor device 1 according to the third embodiment can achieve the same advantages as those of the first embodiment for the internal signal such as the interrupt signal.

The third embodiment can be applied to various internal signals other than the interrupt signal. Such internal signals include an interrupt signal which is at "L" level in a normal period and maintains "H" level in a particular condition, in which a flag is set inside the semiconductor device 1 when it is brought to "H" level.

[4] Fourth Embodiment

[4-1] Configuration

The semiconductor device 1 according to the fourth embodiment relates to a case where the failure detection circuit similar to that of the first embodiment is applied to a control data signal composed of a string of a plurality of bits. In the semiconductor device 1 of the fourth embodiment, the failure detection circuit is provided between the communication controller 4 and the memory 5. The rest of the structure is approximately the same as in the first embodiment. Hereinafter, the points of difference between the semiconductor device 1 according to the fourth and first embodiments will be described.

FIG. 18 illustrates functional blocks in the semiconductor device 1 according to the fourth embodiment. The structure is similar to that in FIG. 2 including the components, except that the failure detection circuit is provided between the communication controller 4 and the memory 5. EXOR gates 7 and 8, low-frequency signal generator 9 and 11, and a comparator 10 function as a failure detection circuit 700.

The I/O control module 3 is coupled at an input terminal to the semiconductor device 2.

The communication controller 4 is coupled at an input terminal to an output terminal of the I/O control module 3. The communication controller 4 outputs the control data signal from a first output terminal. The communication controller 4 outputs an interrupt signal from a second output terminal. The communication controller 4 is coupled at the first output terminal to the node A.

The EXOR gate 7 is coupled at the first input terminal to the node A. The output terminal of the EXOR gate 7 is coupled to the node B. The nodes B and C are coupled. The EXOR gate 8 is coupled at the first input terminal to the node C.

The low-frequency signal from the low-frequency signal generator 9 is supplied to the second input terminal of the EXOR gate 7 and the second input terminal of the EXOR gate 8. The output terminal of the EXOR gate 8 is coupled to the node D. The memory 5 is coupled at the input terminal to the node D. The memory 5 receives the control data signal from the input terminal.

The comparator 10 is coupled at the first input terminal to the node D, and coupled at the second input terminal to the node A. The comparator 10 receives a signal (comparator signal 1) at the first input terminal, and receives the control data signal at the second input terminal. The comparator 10 compares the comparator signal 1 and the control data signal. The comparator 10 outputs an alarm signal based on the result of comparison.

[4-2] Timing Chart of Each Signal

Figure 19:
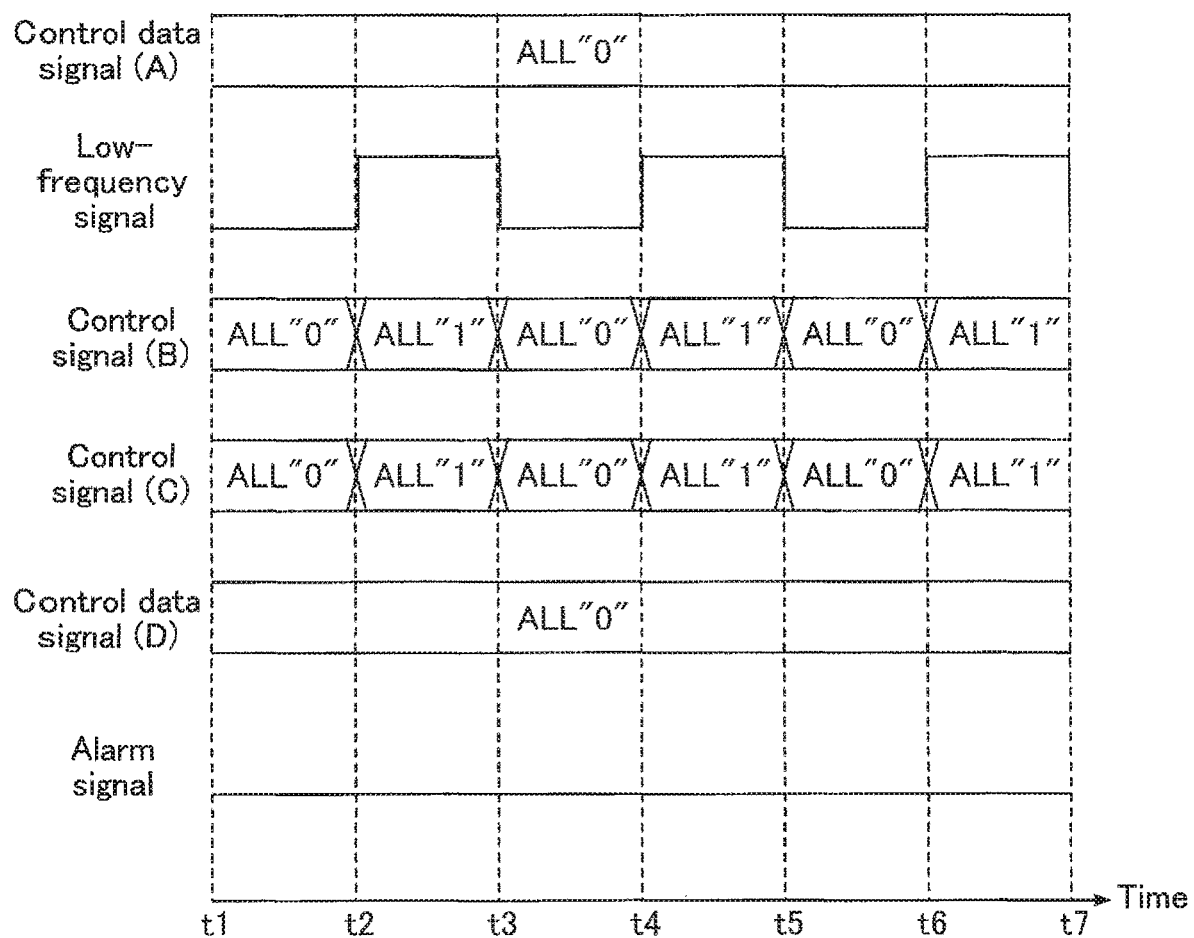
FIG. 19 illustrates an example of a timing chart of each signal when the semiconductor device 1 according to the fourth embodiment is in a normal state and not in operation.
Figure 20:
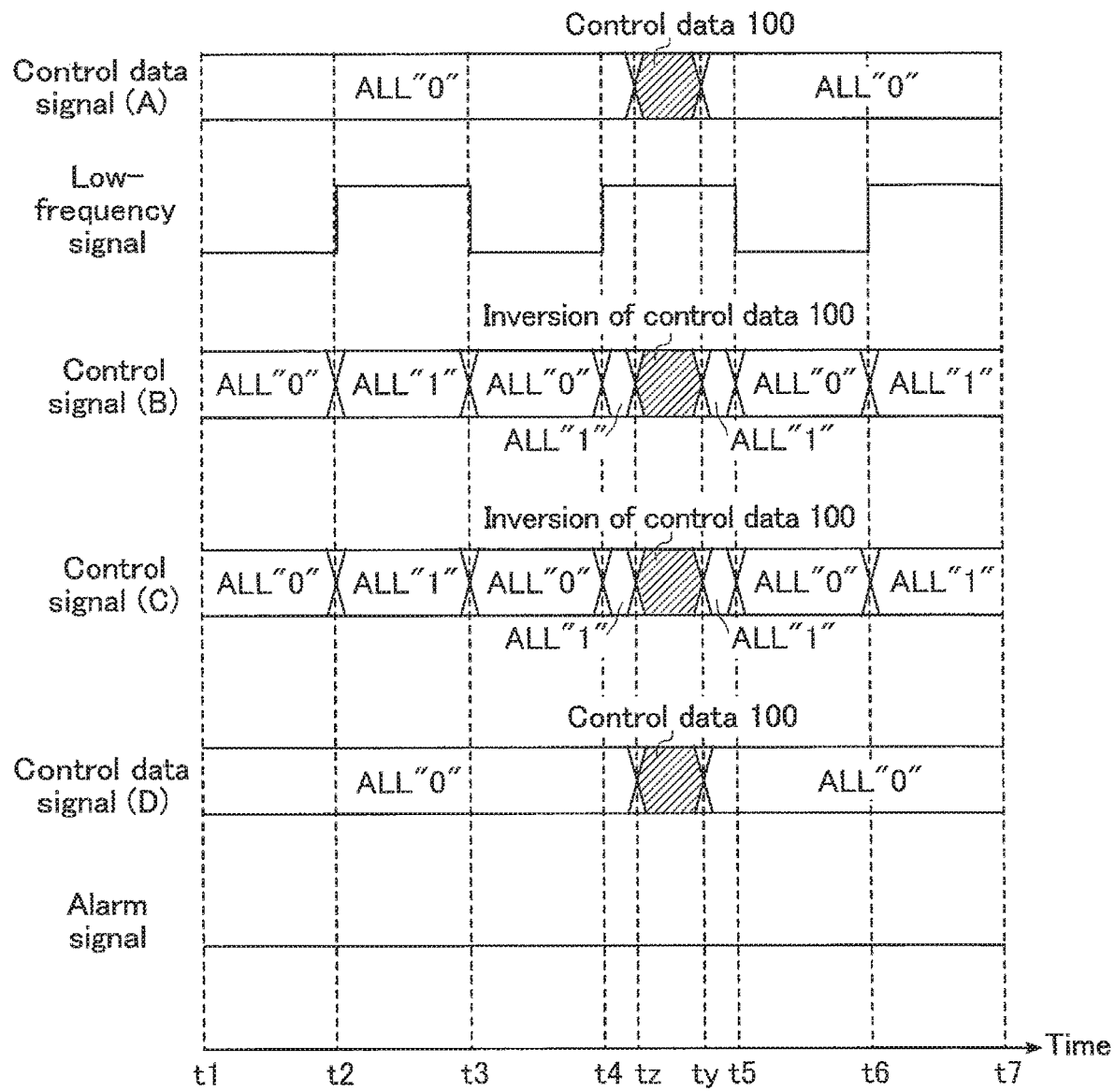
FIG. 20 illustrates an example of a timing chart of each signal when the semiconductor device 1 according to the fourth embodiment is in a normal state and has started communication.
Figure 21:
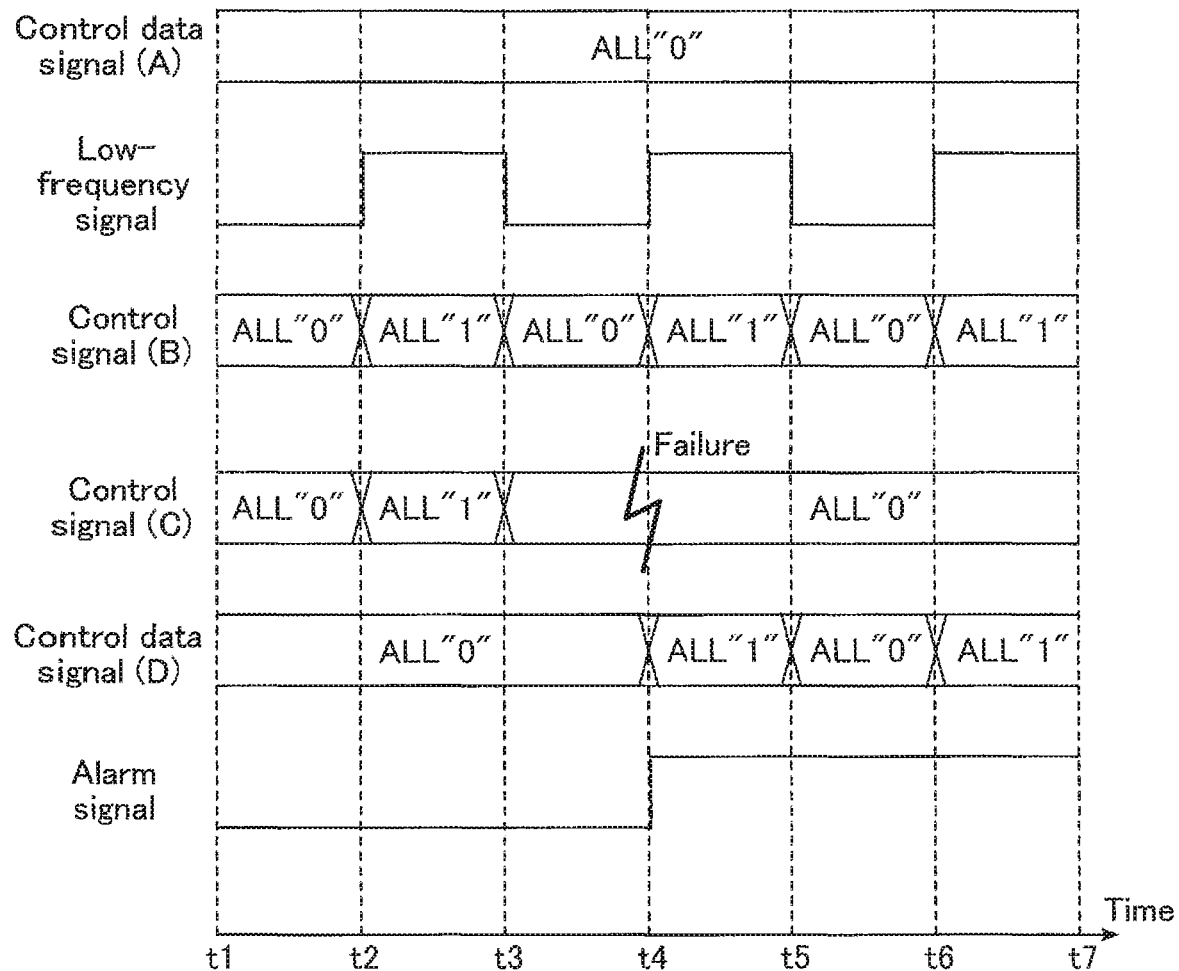
FIG. 21 illustrates an example of a timing chart of each signal when the semiconductor device 1 according to the fourth embodiment is in a failure state and not in operation.

Hereinafter, a description will be given of an example of a timing chart of each signal in the semiconductor device 1 according to the fourth embodiment. During each operation, the semiconductor device 1 according to the fourth embodiment exhibits the timing charts as in FIGS. 19 to 21. In FIGS. 19 to 21, control data signal (A), control signal (B), control signal (C), and control data signal (D) indicate signals of node A, node B, node C, and node D of FIG. 18, respectively. The low-frequency signal in FIGS. 19 to 21 is similar to that of FIG. 3. Times t1 to t7 in FIGS. 15 to 17 are similar to those of FIG. 3.

[4-2-1] in Normal State and when not in Operation

FIG. 19 illustrates an example of a timing chart of each signal when the semiconductor device 1 according to the fourth embodiment is in a normal state and not in operation. The normal state in the fourth embodiment is a state in which a normal operation is performed at least between nodes B and C of FIG. 19. In the following description, the states of the control data signal (A), control signal (B), control signal (C), and control data signal (D) are described based on transmitted data, not levels. "0" data is indicated by one of "H" level or "L" level. "1" data is indicated by the other of "H" level or "L" level. This is because in the control data signal generated by the communication controller 4, whether the "H" level signal is assigned to "0" data or "1" data is a discretionary matter.

The control data signal (A) is a signal when the semiconductor device 1 is not in operation, and is always at a level indicating "0" data.

In the control signal (B), a level indicating "0" data and a level indicating "1" data are switched at the same timing when the level of the low-frequency signal is switched. Specifically, the control signal (B) is at a level indicating "0" data when the low-frequency signal is at "L" level, and at a level indicating "1" data when the low-frequency signal is at "H" level. As in the control signal (B) of the first embodiment, this is because the EXOR gate 7 transmits the exclusive OR of the levels of the received interrupt signal (A) and low-frequency signal as the control signal (B).

The control signal (C) is the same as the control signal (B). Since FIG. 19 illustrates an example in which the normal operation is performed between the nodes B and C, the control signal (C) has the same level as the level of the received control signal (B).

The control data signal (D) has a level always indicating "0" data. As in the control signal (D) of the first embodiment, this is because the EXOR gate 8 transmits the exclusive OR of the levels of the received control (C) and low-frequency signal as the control data signal (D). As described above, the control signal (C) and the low-frequency signal are signals whose levels switch at the same timing, and therefore, the EXOR gate 8 transmits the control data signal (D) at the level always indicating "0" data. In this manner, in the example in which the semiconductor device 1 is not in operation and the normal operation is performed between the nodes B and C, the control data signal (D) has the same level as the level of the control data signal (A).

The alarm signal is always at "L" level. As described above, this is because the control data signal (A) and the control data signal (D) are always at the same level, and therefore the comparator 10 transmits the alarm signal always at "L" level. That is, when the semiconductor device 1 according to the fourth embodiment is in a normal state and not in operation, the alarm signal is always at "L" level.

[4-2-2] in Normal State and when Starting Communication

FIG. 20 illustrates an example of a timing chart of each signal when the semiconductor device 1 according to the fourth embodiment is in a normal state and has started communication. FIG. 20 illustrates an example in which control data 100 is transmitted from time tz to time ty (described below). The control data 100 is a control data signal transmitted from the communication controller 4 and composed of a string of a plurality of bits, and is a signal configured in a combination of a level indicating "0" data and a level indicating "1" data. Time tz is a quarter of the time from time t4 to time t5. Time ty is similar to that of FIG. 4. Each signal is transmitted in a behavior similar to when the semiconductor device 1 is not in operation as illustrated in FIG. 19 other than the time from time tz to time ty when the control data 100 is transmitted. In the following, a description will be given of only the operation between time tz and time ty in each signal.

The control data signal (A) has a level indicating the control data 100 between time tz and time ty.

The control signal (B) has, between time tz to time ty, inverted data in which the level of the control data 100 is inverted. As in FIG. 3, this is because the EXOR gate 7 transmits the exclusive OR of the levels of the received control signal (A) and low-frequency signal as the control signal (B). For example, when the control data signal (A) is at "L" level, the low-frequency signal is at "H" level; therefore, the control signal (B) is at "H" level. When the control data signal (A) is at "H" level, the low-frequency signal is at "H" level; therefore, the control signal (B) is at "L" level. Thus, the control signal (B) is inverted data of the control data 100.

The control signal (C) has, between time tz and time ty, inverted data of the control data 100 which is the same as the control signal (B). As in FIG. 3, FIG. 19 illustrates an example in which the normal operation is performed between the nodes B and C, and therefore the control signal (C) has the same level as the level of the received control signal (B).

The control data signal (D) has, between time tz and time ty, the same level as the control data 100. This is because the EXOR gate 8 transmits the exclusive OR of the levels of the received control signal (C) and low-frequency signal as the control data signal (D). For example, when the control data signal (A) is at "L" level, the low-frequency signal is at "H" level; therefore, the control signals (B) and (C) are at "H" level, and the control data signal (D) is at "L" level. When the control data signal (A) is at "H" level, the low-frequency signal is at "H" level; therefore, the control signals (B) and (C) are at "L" level, and the control data signal (D) is at "H" level. Thus, the control data signal (D) is the same level as the control data 100. In this manner, in the example in which the semiconductor device 1 has started communication and the I/O control module 3 operates normally, the control data signal (D) has the same level as the level of the control data signal (A).

The alarm signal is always at "L" level. As described above, this is because the control data signal (A) and the control data signal (D) are always at the same level, and therefore, the comparator 10 transmits the alarm signal always at "L" level. That is, when the semiconductor device 1 according to the fourth embodiment is in a normal state and has started communication, the alarm signal is always at "L" level. As is apparent from the above description, in addition to the communication start time, during the period when the semiconductor device 1 is in a normal state, the control data signal (D) has the same level as the level of the control data signal (A), and the alarm signal is always at "L" level.

[4-2-3] Failure State and not in Operation

FIG. 21 illustrates an example of a timing chart of each signal when the semiconductor device 1 according to the fourth embodiment is in a failure state and not in operation. The failure state in the fourth embodiment is a state in which there is a failure at time t4 between the nodes B and C of FIG. 18, and the signal at the normal level cannot be transmitted in correctly. Each signal is transmitted in the same behavior as in the normal state of FIG. 19 until reaching between the nodes B and C where a failure has occurred.

The control data signal (A), the low-frequency signal, and the control signal (B) are unaffected by a failure between the nodes B and C. Therefore, the control data signal (A), the low-frequency signal, and the control signal (B) are similar to those of FIG. 19. Furthermore, until time t4 at which a failure occurs, each signal is transmitted in a manner similar to when the semiconductor device 1 is not in operation as illustrated in FIG. 15.

The control signal (C) has the same level as the level of the control signal (B) until time t4 at which a failure occurs. At and after time t4, the control signal (C) cannot transmit the level of the control signal (B) in an accurate manner, and transmits, for example, the signal always indicating "0" data.

The control data signal (D) is at a level always indicating "0" data until time t4. At and after time t4, the EXOR gate 8 transmits the exclusive OR of the levels of the received alarm signal (C) and low-frequency signal as the control data signal (D). Thus, the control data signal (D) is brought to "H" level in the period when the control signal (C) and the low-frequency signal are not at the same level. In this manner, in an example in which the semiconductor device 1 is not in operation and the failure occurs between the nodes B and C, the control data signal (D) has a period when the control data signal (D) has a level different from the level of the control data signal (A) after the time when the failure occurs.

Until time t4, the alarm signal is always at "L" level, and is similar to that of FIG. 19. At and after time t4, it is always at "H" level. More precisely, after the failure occurs, it is always at "H" level after the time when the control data signal (D) is first brought to "H" level (time t4 in this embodiment). As described in the first embodiment, this is because upon receipt of the control data signal (A) and the control data signal (D) having different levels, the comparator 10 transmits the alarm signal always at "H" level thereafter. That is, when the semiconductor device 1 according to the fourth embodiment is in a failure state and not in operation, the alarm signal has a period when it has "H" level.

[4-3] Advantages (Effects

According to the semiconductor device 1 of the fourth embodiment described above, the same advantages as those of the first embodiment can be provided for the control data signal composed of a string of a plurality of bits.

As the first embodiment detects a failure of the I/O control module 3, the fourth embodiment detects a failure between the nodes B and C of FIG. 18. That is, the semiconductor device 1 according to the fourth embodiment compares the level of the low-frequency signal passing through between the nodes B and C via the EXOR gate 7 and the level of the low-frequency signal not input between the nodes B and C to check for a difference therebetween.

The control signal (B) input into the node B is the exclusive OR of the low-frequency signal from the low-frequency signal generator 9 and the control data signal (A). Thus, even during the period when the control data signal (A) stays always at the level indicating "0" data due to the semiconductor device 1 not in operation, the control signal (B) has a level that changes periodically, and the level switches at the same timing as the low-frequency signal. Then, the control signal (C) passing through the nodes B and C and the low-frequency signal are compared by the EXOR gate 8. When the semiconductor device 1 is not in operation and the portion between the nodes B and C is in a normal state, the control signal (C) and the low-frequency signal have the levels that switch at the same timing. Thus, the control data signal (D) and the control data signal (A) are signals at the same level.

On the other hand, when the semiconductor device 1 is not in operation and there is a failure between the nodes B and C, because the control signal (C) remains at the same level, the control signal (C) and the low-frequency signal have levels that switch at different timings. Thus, the control data signal (D) and the control data signal (A) are signals at different levels.

By detecting a mismatch between the level of the control data signal (A) and the level of the control data signal (D) (i.e., a mismatch between the timing of the switching of the level of the control signal (C) and the level of the low-frequency signal), it is possible to detect a failure between the nodes B and C even when the semiconductor device 1 is not in operation.

As described above, the semiconductor device 1 according to the fourth embodiment can achieve the same advantages as those of the first embodiment for the control data signal composed of a plurality of bits.

[5] Other Modifications

In the first to fourth embodiments of the present invention, the configuration of the semiconductor device 1 may be different from the above-described configuration. For example, components not illustrated may be included and may be coupled by interconnects not illustrated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A failure detection circuit, comprising:
a first signal generation circuit that outputs a first signal having a level that changes periodically between a first level and a second level;
a first circuit that outputs a third signal having the first level during a period over which a second signal having the first level or the second level has the same level as the first signal, and having the second level during a period over which the second signal has a level different from the first signal;
a second circuit that outputs a fifth signal having the first level during a period over which a fourth signal having the same level as the third signal has the same level as the first signal, and having the second level during a period over which the fourth signal has a level different from the first signal; and
a third circuit that outputs a sixth signal having a third level during a period over which the second signal and the fifth signal have the same level, and having a fourth level during a period over which the second signal and the fifth signal have different levels.

2. The failure detection circuit of claim 1, wherein a node that outputs the third signal of the first circuit is coupled to a node that receives the fourth signal of the second circuit.

3. The failure detection circuit of claim 1, wherein the first circuit and the second circuit are exclusive OR gates.

4. The failure detection circuit of claim 1, wherein
the first circuit receives the second signal at a first input terminal, receives the first signal at a second input terminal, and outputs the third signal at a first output terminal to a first node,
the first node outputs the third signal to a second node,
the second node outputs the fourth signal,
the second circuit receives the fourth signal at a third input terminal, receives the first signal at a fourth input terminal, and outputs the fifth signal at a second output terminal, and
the third circuit receives the fifth signal at a fifth input terminal, receives the second signal at a sixth input terminal, and outputs the sixth signal at a third output terminal.

5. A failure detection circuit, comprising:
a first signal generation circuit that outputs a first signal having a level that changes periodically between a first level and a second level;
a first circuit that outputs a third signal having the first level during a period over which a second signal having the first level or the second level has the same level as the first signal, and having the second level during a period over which the second signal has a level different from the first signal;
a second signal generation circuit that outputs a fourth signal having a level that changes periodically between the first level and the second level, and being at the same level as the first signal;
a second circuit that outputs a sixth signal having the first level during a period over which the fourth signal and a fifth signal having the same level as the third signal of the first level and the second level have the same level, and having the second level during a period over which the fourth signal and the fifth signal have different levels; and
a third circuit that outputs a seventh signal having a third level during a period over which the second signal and the sixth signal have the same level, and having a fourth level during a period over which the second signal and the sixth signal have different levels.

6. The failure detection circuit of claim 5, wherein a node that outputs the third signal of the first circuit is coupled to a node that receives the fifth signal of the second circuit.

7. The failure detection circuit of claim 5, wherein the first circuit and the second circuit are exclusive OR gates.

8. The failure detection circuit of claim 5, wherein
the first circuit receives the second signal at a first input terminal, receives the first signal at a second input terminal, and outputs the third signal at a first output terminal to a first node,
the first node outputs the third signal to a second node,
the second node outputs the fifth signal,
the second circuit receives the fifth signal at a third input terminal, receives the fourth signal at a fourth input terminal, and outputs the sixth signal at a second output terminal, and
the third circuit receives the sixth signal at a fifth input terminal, receives the second signal at a sixth input terminal, and outputs the seventh signal at a third output terminal.

9. A semiconductor device, comprising:
the failure detection circuit of claim 1; and
a first module that receives the third signal and outputs the fourth signal.

10. A semiconductor device, comprising:
the failure detection circuit of claim 4; and
a first module that receives the third signal from the first node and outputs the fourth signal to the second node.

11. The semiconductor device of claim 10, further comprising a second module that outputs the second signal to the first circuit.

12. A semiconductor device, comprising:
the failure detection circuit of claim 5; and
a first module that receives the third signal and outputs the fifth signal.

13. A semiconductor device, comprising:
the failure detection circuit of claim 8; and
a first module that receives the third signal from the first node and outputs the fifth signal to the second node.

14. A failure detection circuit, comprising:
a first signal generation circuit that outputs a first signal having a level that changes periodically between a first level and a second level;
a first circuit that outputs a third signal having the first level during a period over which a second signal having the first level or the second level has the same level as the first signal, and having the second level during a period over which the second signal has a level different from the first signal; and
a second circuit that outputs a fifth signal having the first level during a period over which a fourth signal having the same level as the third signal has the same level as the first signal, and having the second level during a period over which the fourth signal has a level different from the first signal,
wherein a node that outputs the third signal of the first circuit is coupled to a node that receives the fourth signal of the second circuit.

15. The failure detection circuit of claim 14, wherein the first circuit and the second circuit are exclusive OR gates.

16. The failure detection circuit of claim 14, wherein
the first circuit receives the second signal at a first input terminal, receives the first signal at a second input terminal, and outputs the third signal at a first output terminal to a first node,
the first node outputs the third signal to a second node,
the second node outputs the fourth signal, and
the second circuit receives the fourth signal at a third input terminal, receives the first signal at a fourth input terminal, and outputs the fifth signal at a second output terminal.

17. The semiconductor device of claim 16, further comprising a second module that outputs the second signal to the first circuit.

18. A failure detection circuit, comprising:
a first signal generation circuit that outputs a first signal having a level that changes periodically between a first level and a second level;
a first circuit that outputs a third signal having the first level during a period over which a second signal having the first level or the second level has the same level as the first signal, and having the second level during a period over which the second signal has a level different from the first signal; and
a second circuit that outputs a fifth signal having the first level during a period over which a fourth signal having the same level as the third signal has the same level as the first signal, and having the second level during a period over which the fourth signal has a level different from the first signal,
wherein the first circuit and the second circuit are exclusive OR gates.

19. The failure detection circuit of claim 18, wherein
the first circuit receives the second signal at a first input terminal, receives the first signal at a second input terminal, and outputs the third signal at a first output terminal to a first node,
the first node outputs the third signal to a second node,
the second node outputs the fourth signal, and
the second circuit receives the fourth signal at a third input terminal, receives the first signal at a fourth input terminal, and outputs the fifth signal at a second output terminal.

20. A semiconductor device, comprising:
the failure detection circuit of claim 18; and
a first module that receives the third signal and outputs the fourth signal.

21. A semiconductor device, comprising:
the failure detection circuit of claim 19; and
a first module that receives the third signal from the first node and outputs the fourth signal to the second node.

22. The semiconductor device of claim 21, further comprising a second module that outputs the second signal to the first circuit.

* * * * *